(12) United States Patent
Korenaga

(10) Patent No.: US 7,547,998 B2
(45) Date of Patent: *Jun. 16, 2009

(54) ALIGNING APPARATUS INCLUDING AN ATTRACTION PREVENTING PLATE PROVIDED BETWEEN PERMANENT MAGNET AND MAGNETIC MEMBER

(75) Inventor: Nobushige Korenaga, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/415,175

(22) Filed: May 2, 2006

(65) Prior Publication Data

US 2006/0202568 A1 Sep. 14, 2006

Related U.S. Application Data

(62) Division of application No. 11/068,784, filed on Mar. 2, 2005, now Pat. No. 7,075,197.

(30) Foreign Application Priority Data

Mar. 3, 2004 (JP) ............... 2004-059162

(51) Int. Cl.
*H02K 41/00* (2006.01)

(52) U.S. Cl. ....................... 310/12; 310/90.5

(58) Field of Classification Search ............... 310/12, 310/13, 90.5; 355/53, 72
See application file for complete search history.

(56) References Cited

U.S. PATENT DOCUMENTS

| | | | | |
|---|---|---|---|---|
| 4,555,650 A | 11/1985 | Asakawa | ............ | 318/135 |
| 5,196,745 A | 3/1993 | Trumper | ............ | 310/12 |
| 5,780,943 A | 7/1998 | Ono | ............ | 310/12 |
| 5,828,412 A | 10/1998 | Fautier et al. | ............ | 348/415 |
| 5,886,432 A | 3/1999 | Markle | ............ | 310/12 |
| 5,925,956 A | 7/1999 | Ohzeki | ............ | 310/90.5 |
| 6,040,675 A | 3/2000 | Ono | ............ | 318/649 |
| 6,144,119 A * | 11/2000 | Hazelton | ............ | 310/12 |
| 6,188,147 B1 * | 2/2001 | Hazelton et al. | ............ | 310/12 |
| 6,259,174 B1 | 7/2001 | Ono | ............ | 310/13 |
| 6,445,093 B1 | 9/2002 | Binnard | ............ | 310/12 |
| 6,452,292 B1 | 9/2002 | Binnard | ............ | 310/12 |
| 6,825,583 B2 | 11/2004 | Joung et al. | ............ | 310/16 |
| 6,879,063 B2 | 4/2005 | Frissen et al. | ............ | 310/12 |
| 7,075,197 B2 * | 7/2006 | Korenaga | ............ | 310/12 |
| 2002/0079461 A1 | 6/2002 | Kirschstein et al. | ............ | 250/442.11 |
| 2002/0149270 A1 | 10/2002 | Hazelton | ............ | 310/12 |
| 2003/0136309 A1 | 7/2003 | Shinozaki et al. | ............ | 108/20 |

(Continued)

FOREIGN PATENT DOCUMENTS

JP 8-6642 1/1996

(Continued)

*Primary Examiner*—Karl I Tamai
(74) *Attorney, Agent, or Firm*—Fitzpatrick, Cella, Harper & Scinto

(57) ABSTRACT

An aligning apparatus includes a moving member, a magnetic member arranged vertically above the moving member, a stator unit which is arranged vertically below the moving member and has a plurality of coils, a first magnet unit which is provided to the moving member and generates a force with the magnetic member, and a second magnet unit which is provided to the moving member and generates a force with the stator unit.

17 Claims, 25 Drawing Sheets

U.S. PATENT DOCUMENTS

| | | | |
|---|---|---|---|
| 2004/0004405 A1* | 1/2004 | Ausderau | 310/12 |
| 2004/0032170 A1 | 2/2004 | Tamai et al. | 310/13 |
| 2005/0194843 A1* | 9/2005 | Korenaga | 310/12 |
| 2006/0202568 A1* | 9/2006 | Korenaga | 310/12 |

FOREIGN PATENT DOCUMENTS

| | | |
|---|---|---|
| JP | 11-69764 | 3/1999 |

\* cited by examiner

PORTION A

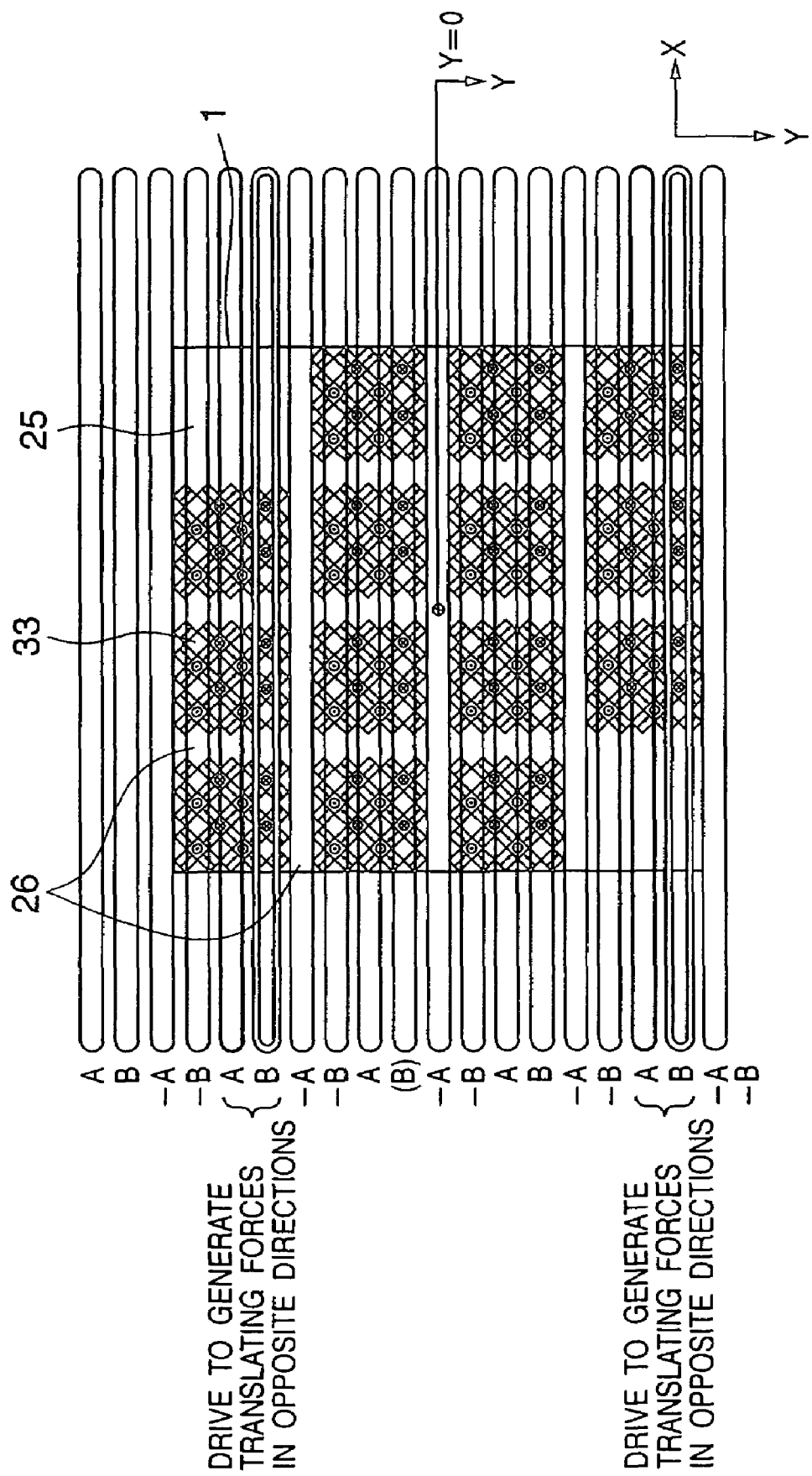

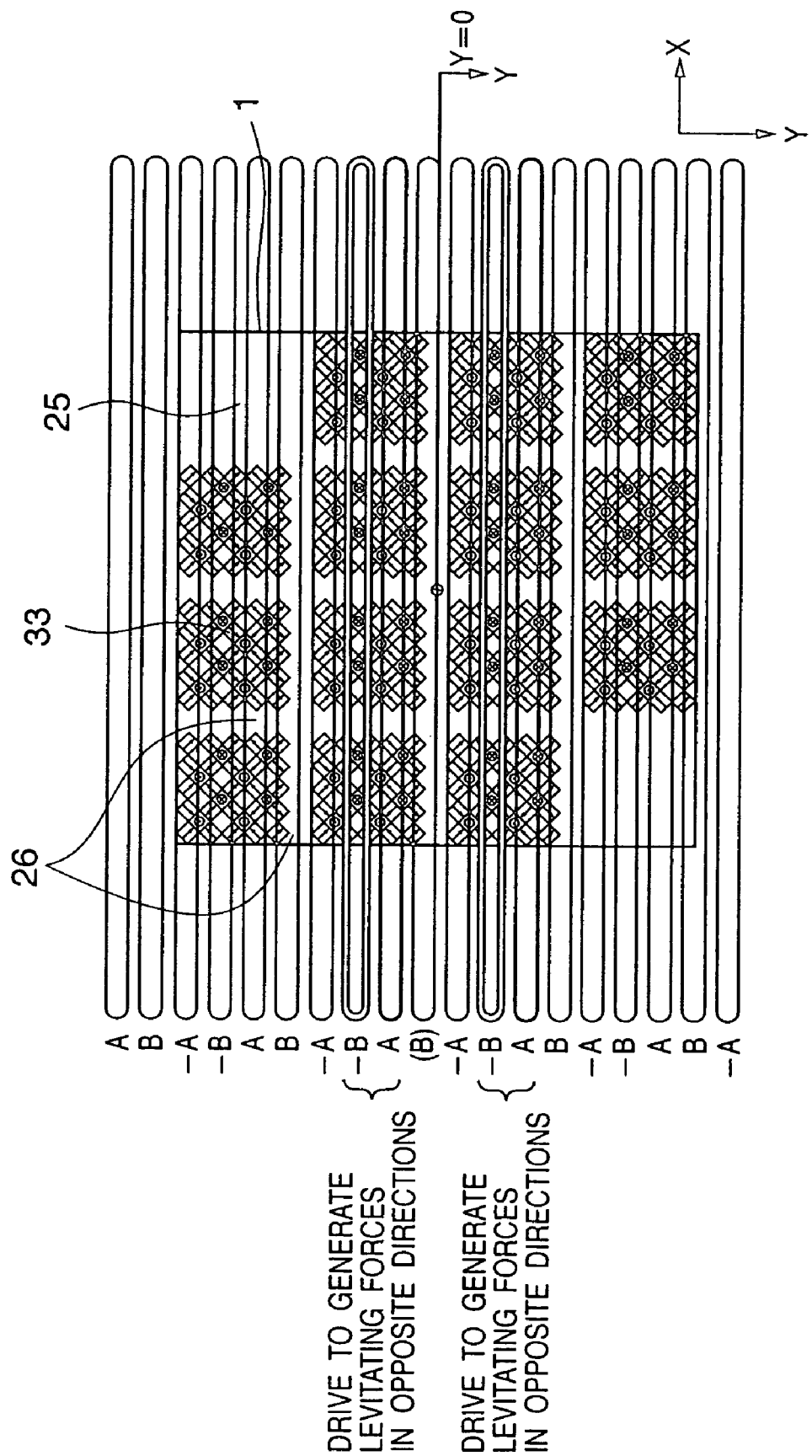

PORTION A

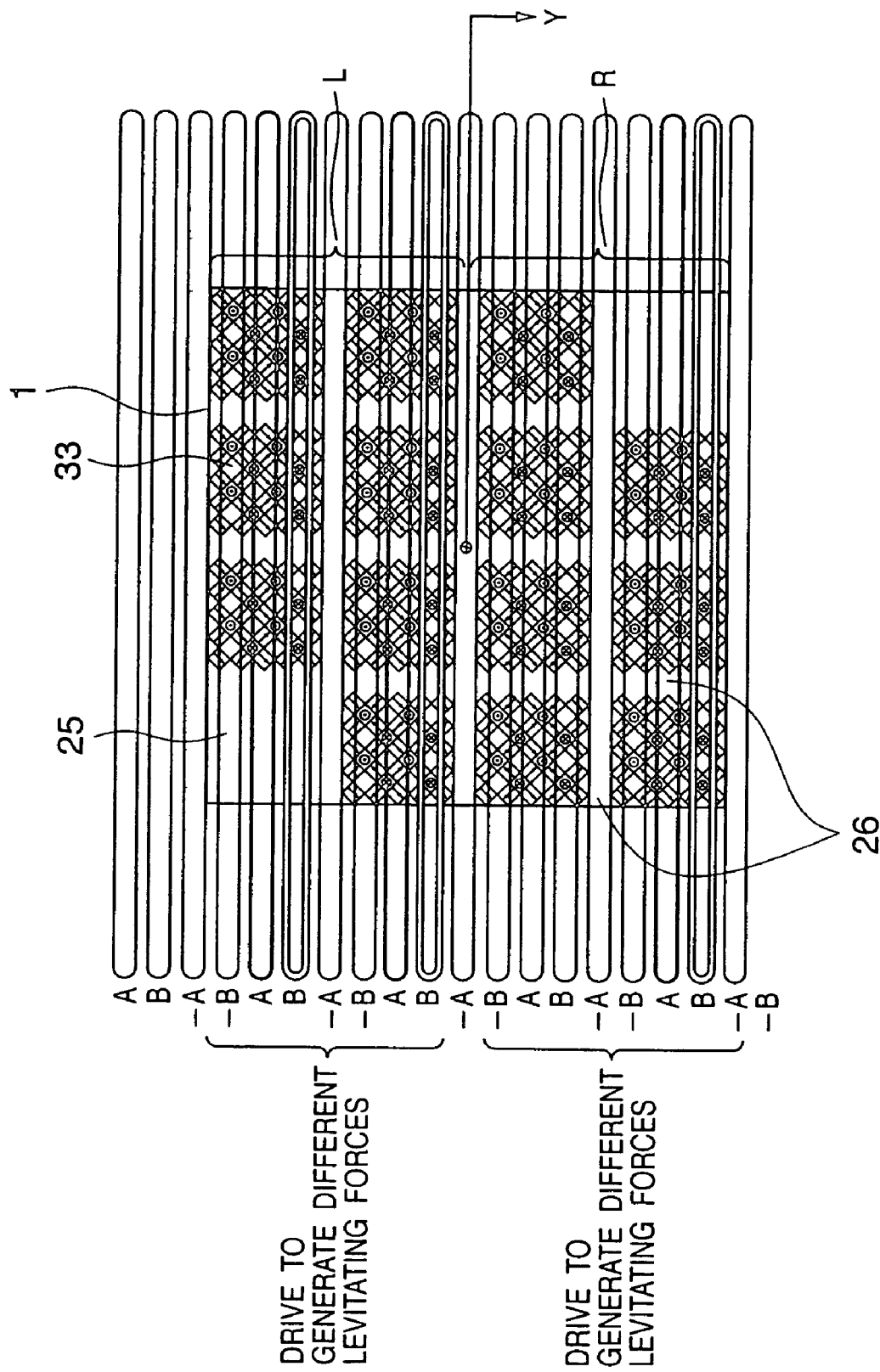

FIG. 17A
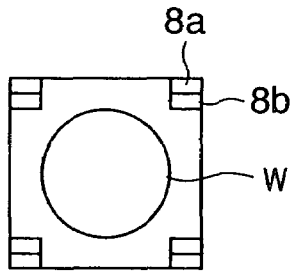
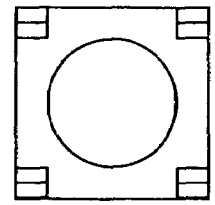
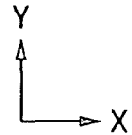
FIG. 17B
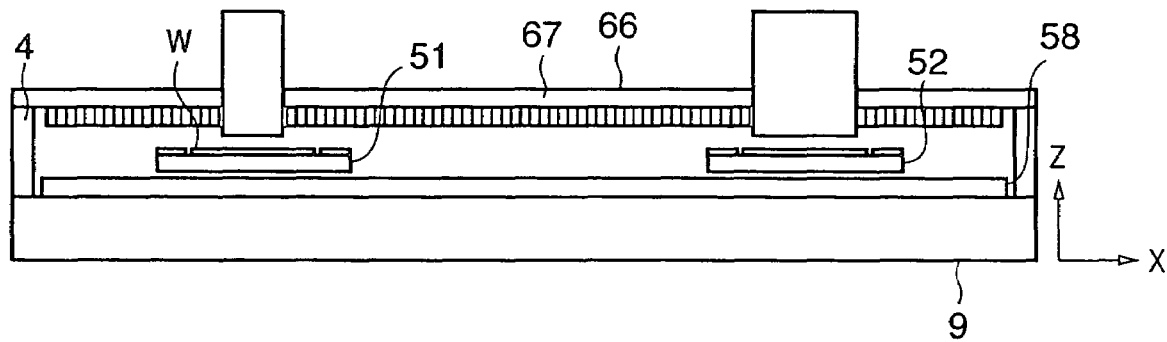
FIG. 17C
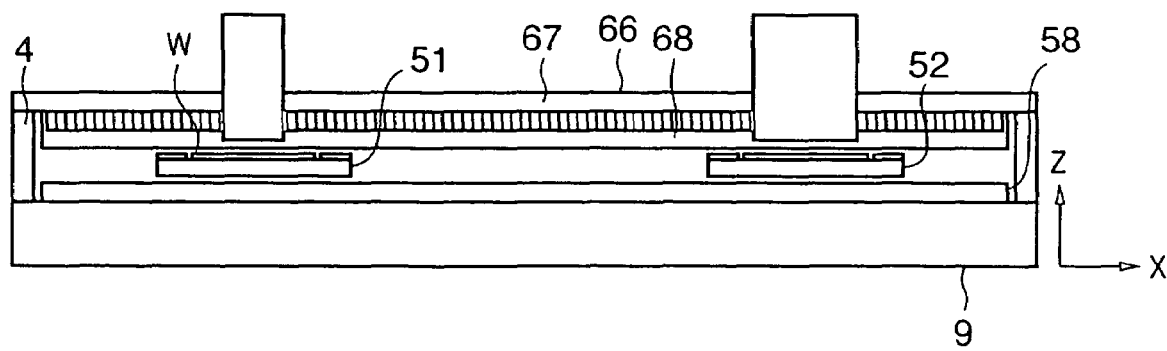

FIG. 19A
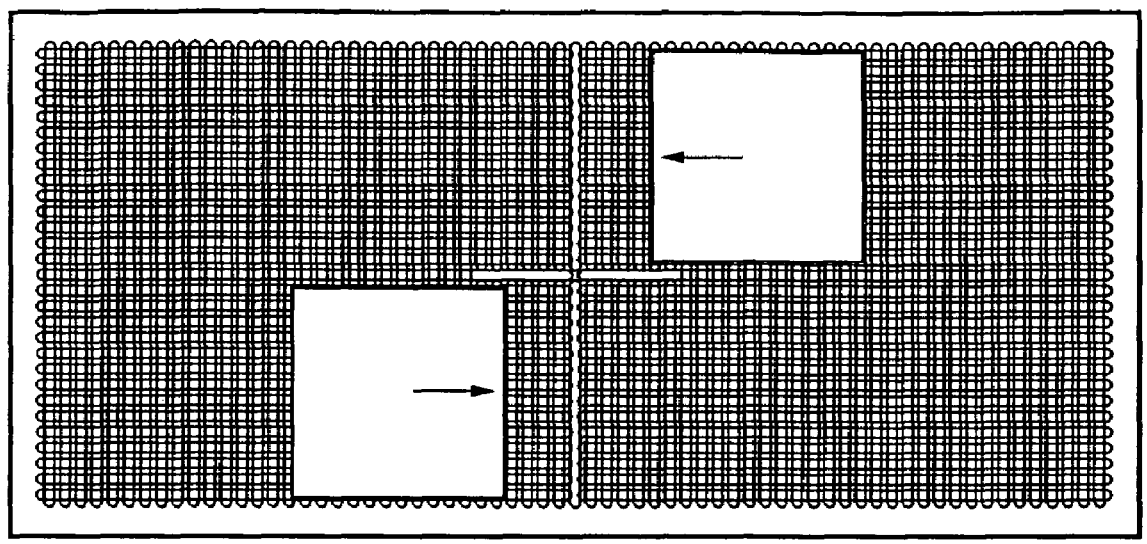
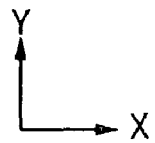
FIG. 19B
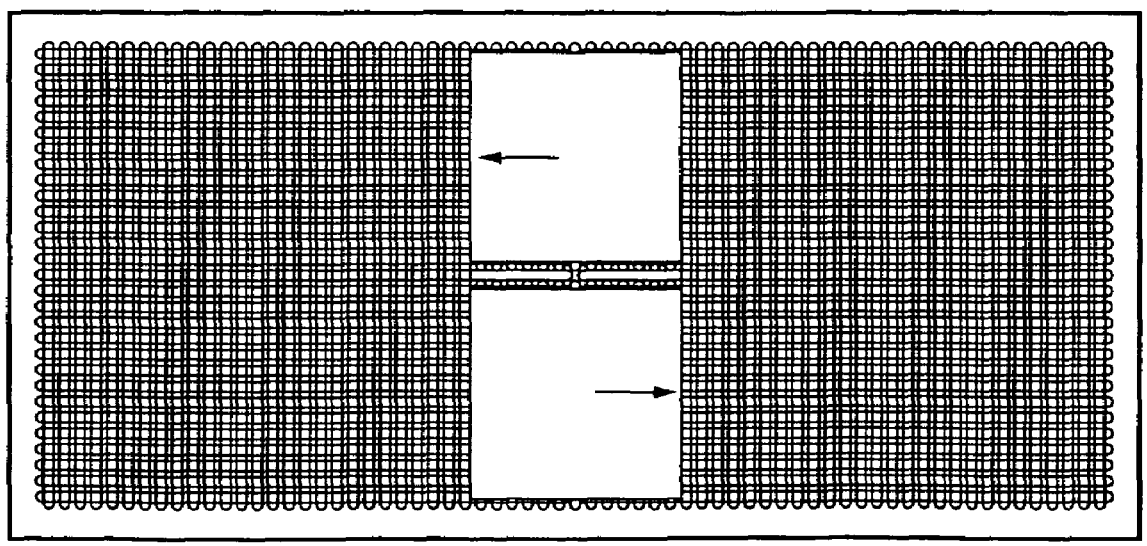
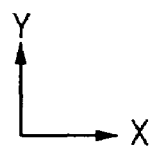

ALIGNING APPARATUS INCLUDING AN ATTRACTION PREVENTING PLATE PROVIDED BETWEEN PERMANENT MAGNET AND MAGNETIC MEMBER

This application is a divisional application of copending U.S. patent application Ser. No. 11/068,784, filed Mar. 2, 2005.

FIELD OF THE INVENTION

The present invention relates to an aligning apparatus for aligning an object and, more particularly, an aligning apparatus in a manufacturing apparatus such as an exposure apparatus for manufacturing devices such as semiconductor devices or liquid crystal devices, which is suitably used to align a substrate and/or an original.

BACKGROUND OF THE INVENTION

In recent years, in an aligning apparatus, e.g., a stage device for an exposure apparatus, which is required for high alignment accuracy, a plane motor type aligning apparatus has been attracting attention. As a plane motor type aligning apparatus, for example, an aligning apparatus described in Japanese Patent Laid-Open No. 08-006642 is available. According to Japanese Patent Laid-Open No. 08-006642, the aligning apparatus uses a movable element obtained by winding a coil around an inductor toothed iron core and a stator obtained by forming tooth-like projections on a magnetic base. The movable element is driven by a pulse motor scheme using a so-called Sawyer's principle. The movable element has an air supply hole. Air is supplied between the stator and movable element to levitate the movable element.

As a plane motor type aligning apparatus which utilizes the Lorentz force, for example, an aligning apparatus described in Japanese Patent Laid-Open No. 11-069764 is available. Japanese Patent Laid-Open No. 11-069764 discloses an aligning apparatus in which a wafer table having a magnet plate is sandwiched by a core table and a top yoke. In this structure, a coil provided to the core plate generates a thrust and a levitating force in the wafer table. Most of the weight of the wafer table is levitated and supported by using a magnetic circuit formed of a core portion, the top yoke, and support columns which support the core portion and top yoke.

Regarding Japanese Patent Laid-Open No. 08-006642, if the movable element is levitated by pneumatic pressure, a problem arises for use in a vacuum. If the driving scheme is the pulse motor scheme using Sawyer's principle, vibration from the stator tends to be transmitted easily, and highly accurate position control is difficult to perform. If the movable element includes a coil, the coil needs a cable for power supply. Accordingly, the coil is susceptible to disturbance from the cable. In this respect, as well, high alignment accuracy control is difficult to perform. When high position accuracy is required in the posture and vertical direction as in an exposure apparatus, with this driving scheme, a fine movement stage for Z tilt direction control must be provided, making the structure complicated.

If the lower core portion is made of a magnetic material as in Japanese Patent Laid-Open No. 11-069764, cogging occurs undesirably, and highly accurate alignment control is difficult to perform.

The present invention has been made in view of the above problems, and has as its object to provide an aligning apparatus, which performs highly accurate alignment while suppressing the influence of coil heat generation.

SUMMARY OF THE INVENTION

In order to achieve the above object, according to the present invention, there is provided an aligning apparatus comprising a moving member, a magnetic member arranged vertically above the moving member, a stator unit, which is arranged vertically below the moving member and has a plurality of coreless coils, a first magnet unit which is provided to the moving member and generates a force with the magnetic member, and a second magnet unit which is provided to the moving member and generates a force with the stator unit.

According to the present invention, an aligning apparatus which can perform highly accurate alignment while suppressing the influence of coil heat generation can be provided.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 8 is a view for explaining driving in an ωz direction;
FIG. 9 is a view for explaining driving in an ωx direction;
FIG. 15 is a view for explaining driving in the Z direction and the ωy direction in the four layer coil;
FIG. 17A is a view showing the two movable element units;
FIG. 17B is a view for describing a structure in which an attracting plate is a stacked layer;
FIG. 17C is a view for describing a structure obtained by providing a cover to the structure of FIG. 17B;
FIGS. 19A and 19B are views for explaining stage interchange.

DETAILED DESCRIPTION OF THE PREFERRED EMBODIMENTS

Preferred embodiments of the present invention will now be described in detail in accordance with the accompanying drawings.

First Embodiment

Figure 1A:
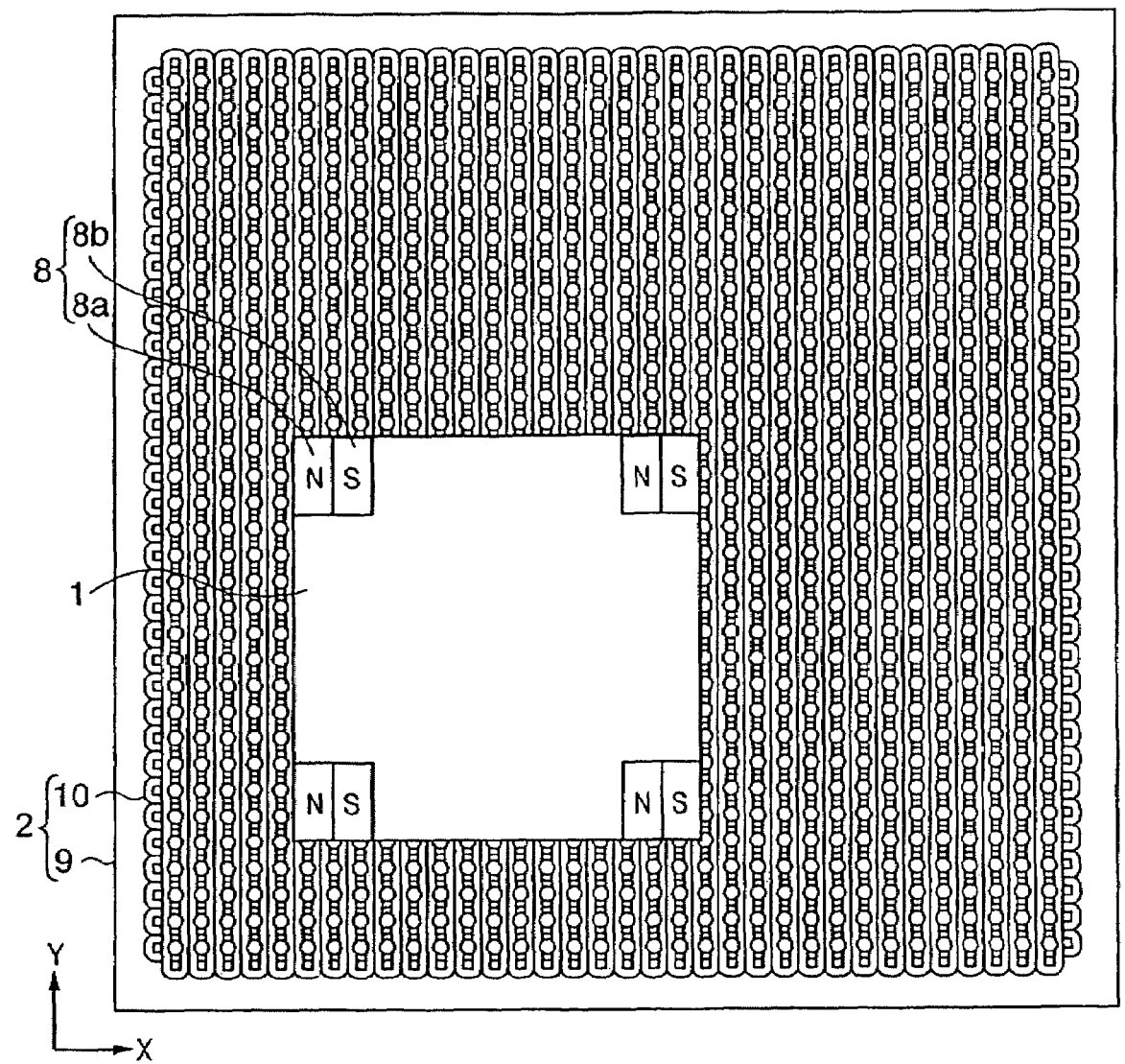
FIGS. 1A and 1B are overall views of the first embodiment.
Figure 1B:
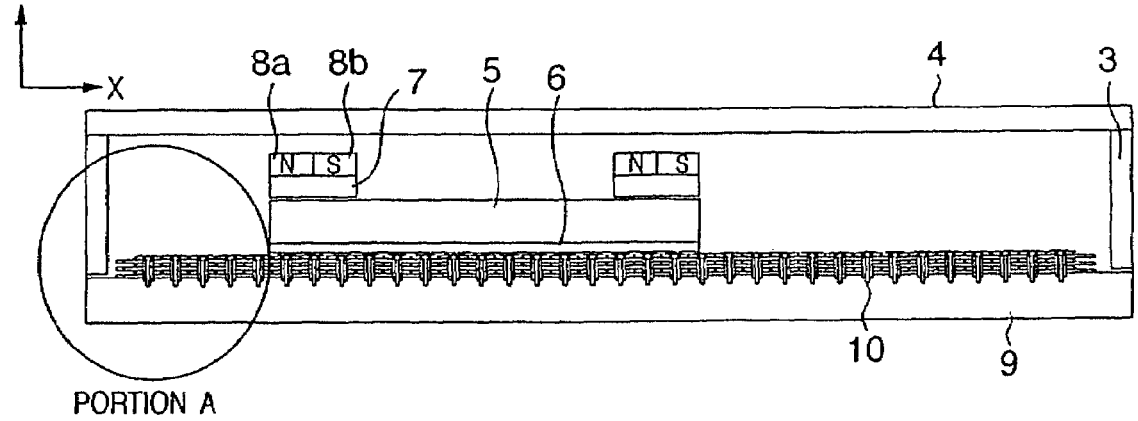

FIGS. 1A and 1B show the first embodiment, in which FIG. 1A is a view seen from the vertical (Z) direction and FIG. 1B is a view seen from the horizontal (Y) direction. An aligning apparatus has a movable element unit 1, which moves with an object mounted on it, a stator unit 2, and an attracting plate 4, which is supported by the stator unit 2, through support columns 3. The movable element unit 1 is a single plate and has a substantially rectangular parallelepiped top plate 5, a magnet unit 6, which is formed under the top plate 5 and formed of a plurality of permanent magnets, and permanent magnets 8, which are provided to the four corners on the top plate 5 through yokes 7. As the material of the top plate 5, one having a high specific rigidity such as a ceramic material is preferable. The attracting plate 4 faces the upper portions of the permanent magnets 8 in a noncontact manner and is made of a magnetic material.

According to this embodiment, two permanent magnets respectively magnetized in N and S poles are arranged at each of the four corners. An attracting force that acts between the permanent magnets 8 and attracting plate 4 can levitate the movable element unit 1 vertically upward (in a +Z direction). In this case, the attracting force is designed to almost balance with the weight of the movable element unit 1. The movable element unit 1 can levitate upon reception of only a small force from the stator unit 2 (to be described later). As a result, the movable element unit 1 is supported by the attracting plate 4 and stator unit 2 in a noncontact manner.

(Explanation of Stator Unit)

Figure 3A:
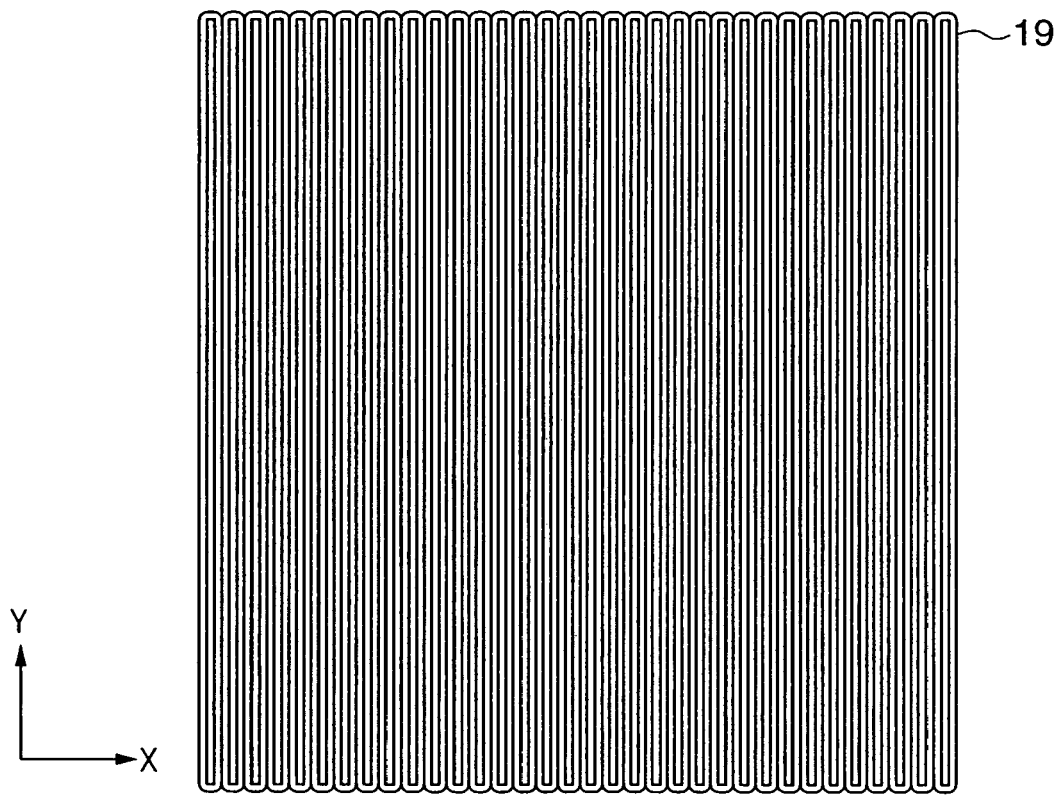
FIGS. 3A and 3B are views each for explaining a coil layer.
Figure 3B:
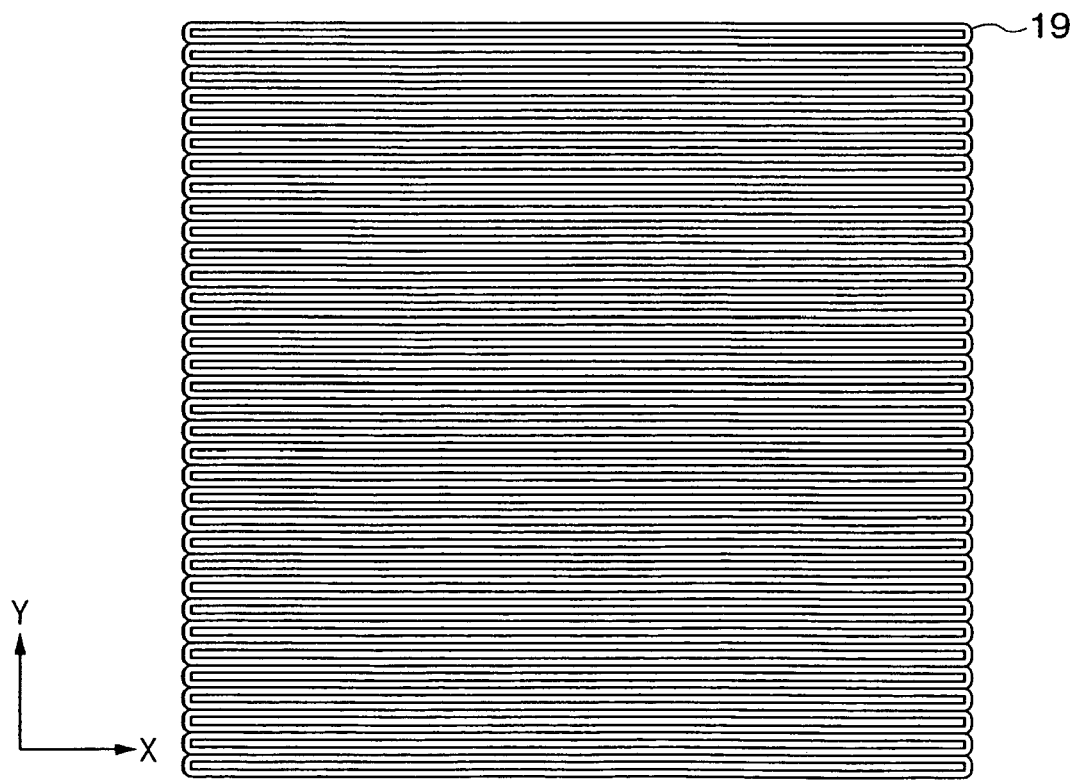

The stator unit 2 has a coil array 10 fixed on a base 9. The coil array 10 forms layers stacked in the Z direction and includes, e.g., six layers of coil arrays. FIGS. 3A and 3B are views each showing the coil array of each layer. The coil array 10 is obtained by arranging a plurality of substantially elliptical coils, having straight portions parallel to a predetermined direction, in a direction perpendicular to the predetermined direction. FIG. 3A shows an example of a coil array having straight portions parallel to the Y direction, and FIG. 3B shows a coil array having straight portions parallel to the X directions. A substantially elliptical coil includes a coil obtained by eliminating the corner portions of a rectangular coil. In this case, the straight portions described above refer to the long-side straight portions of two sets of sides. In this embodiment, three layers in each of which a substantially elliptical coil has straight portions parallel to the X direction and three layers in each of which a substantially elliptical coil has straight portions parallel to the Y directions are stacked, that is, the same numbers of layers are stacked. Each coil is a coreless coil having no magnetic core portion.

Figure 2:
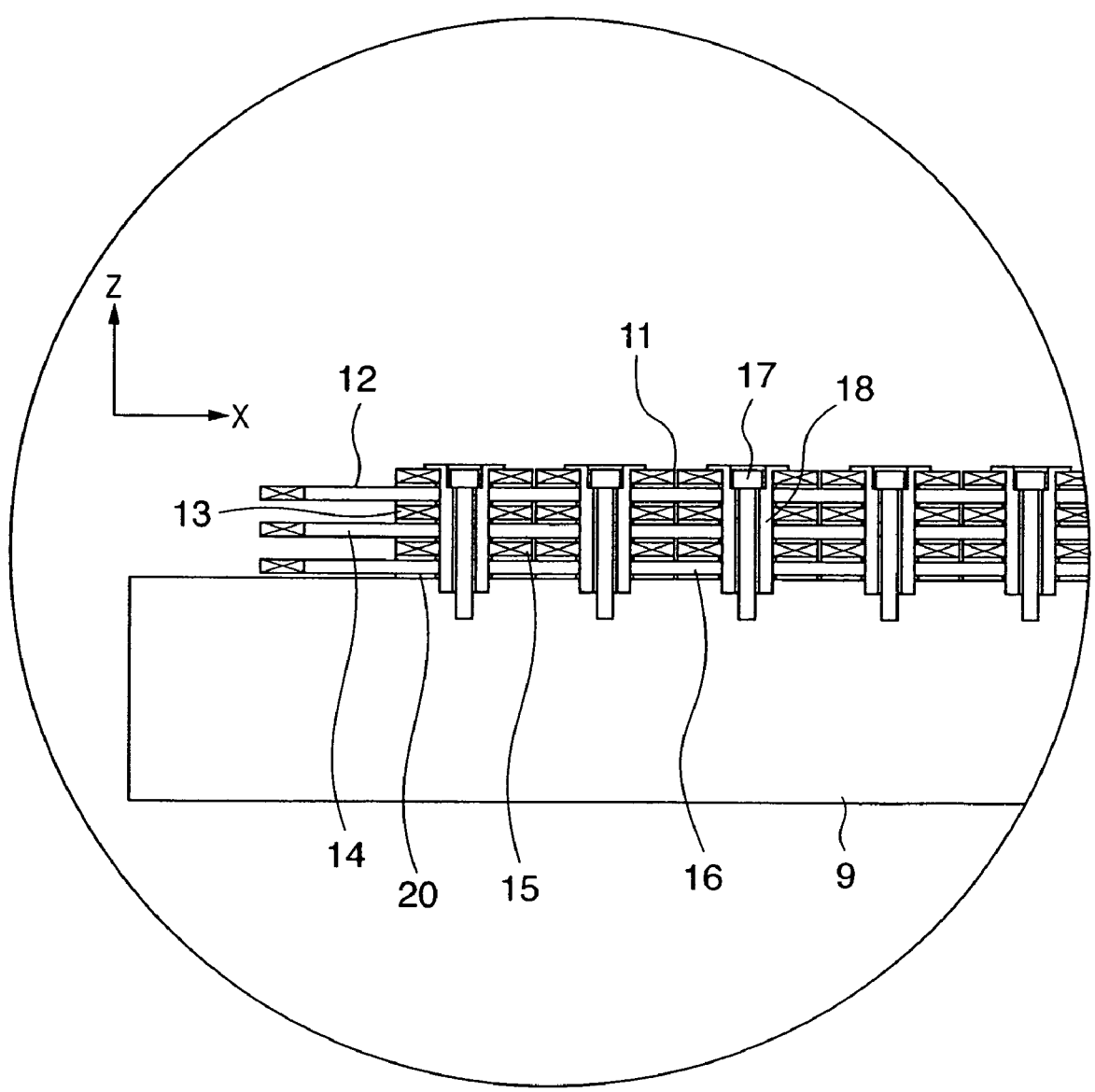
FIG. 2 is an enlarged view of a stator unit.

FIG. 2 is a view showing the coil array of each layer in more detail, in which a portion A of FIG. 1B is enlarged. The coil array 10 is formed on the base 9 through an insulating sheet 20. The coil array 10 includes a first-layer coil array 11, second-layer coil array 12, third-layer coil array 13, fourth-layer coil array 14, fifth-layer coil array 15, and sixth-layer coil array 16 sequentially from the upper side. The substantially elliptical coil of the coil array 11 has straight portions parallel to the Y direction, and is mainly used for driving in the X direction. The substantially elliptical coil of the coil array 12 has straight portions parallel to the X direction, and is mainly used for driving in the Y direction. The substantially elliptical coil of the coil array 13 has straight portions parallel to the Y direction, and is mainly used for driving in the Z direction. The substantially elliptical coil of the coil array 14 has straight portions parallel to the X direction, and is mainly used for driving in the ωZ direction. The substantially elliptical coil of the coil array 15 has straight portions parallel to the Y direction, and is mainly used for driving in the ωY direction. The substantially elliptical coil of the coil array 16 has straight portions parallel to the X direction, and is mainly used for driving in the ωX direction. Insulating sheets 20 are arranged between the respective coil arrays. The insulating sheets 20 serve to prevent short circuiting among the coil arrays.

(Explanation of Movable Element Unit)

Figure 4A:
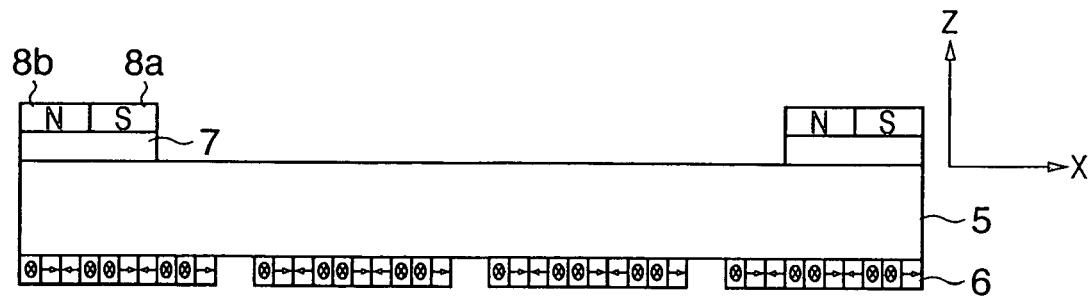
FIGS. 4A and 4B are views for explaining a movable element unit.
Figure 4B:
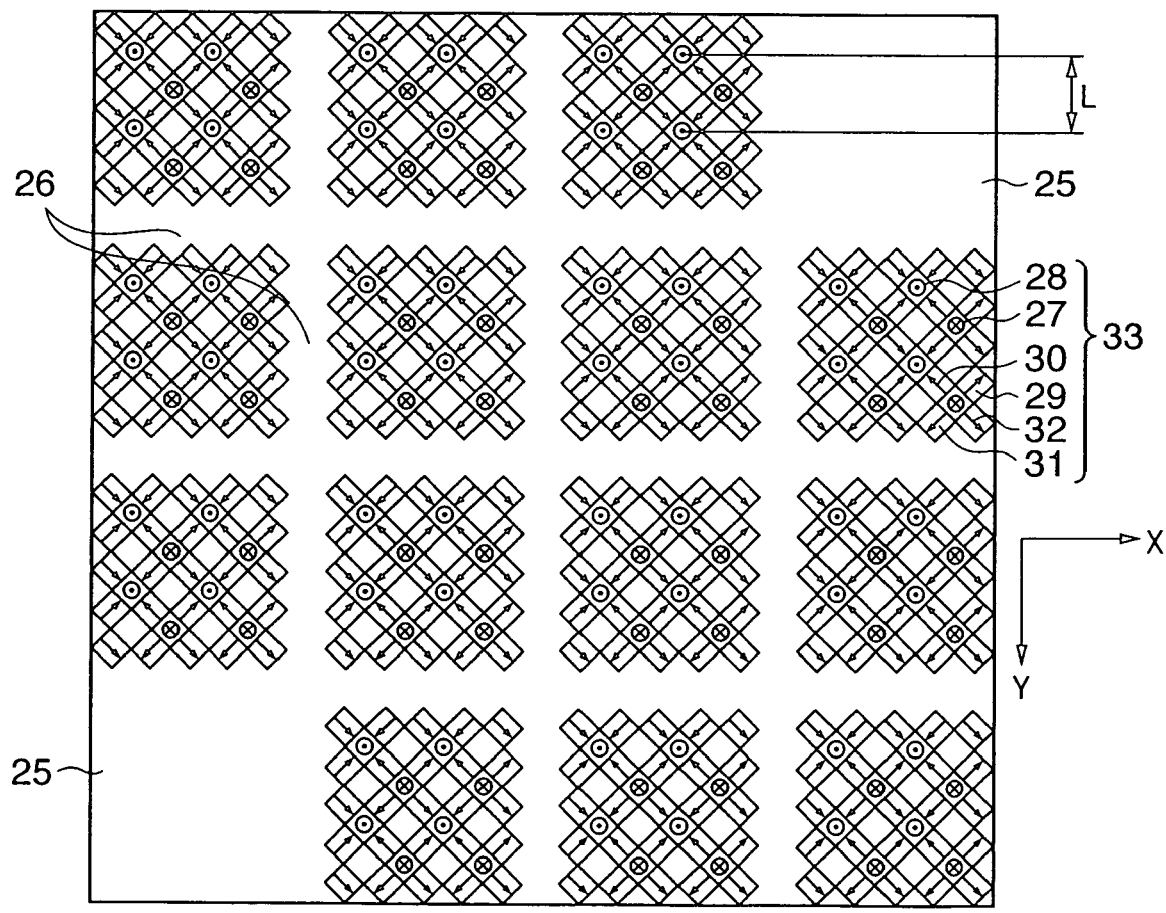

FIGS. 4A and 4B are views showing the movable element unit 1 in detail, in which FIG. 4A is a side view of the movable element unit 1, and FIG. 4B is a bottom view of the movable element unit 1 seen in a vertically upward direction (−Z direction). In FIG. 4B, the front side of the sheet surface coincides with the −Z direction, and the deep side of the sheet surface coincides with the +Z direction. As described above, the magnet unit 6 is fixed to the lower portion of the top plate 5. The magnet unit 6 includes six types of magnets, i.e., a magnet magnetized such that a magnetic flux flows in it in the +Z direction, a magnet magnetized in the −Z direction, and magnets magnetized in directions inclined by 45°, 135°, −135°, and −45°, respectively, with respect to the X direction. In FIG. 4B, the magnet magnetized in the +Z direction is indicated by an x in ○, the magnet magnetized in the −Z direction is indicated by a ° in ○, and magnets magnetized in the directions of 45°, 135°, −135°, and −45°, respectively, with respect to the X direction are indicated by arrows in the corresponding directions.

Referring to FIG. 4B, in a space on the front side of the sheet surface (−Z direction) of the magnet unit 6 (a space between the lower surface of the magnet unit 6 and the coil array 10), a magnetic flux in the +Z direction is generated near each magnet 27 magnetized in the +Z direction. A magnetic flux in the −Z direction is generated near each magnet 28 magnetized in the −Z direction. A magnetic flux in the direction of −135° with respect to the X direction is generated near each magnet 29 magnetized in the direction of 45° with respect to the X direction. A magnetic flux in the direction of −45° with respect to the X direction is generated near each magnet 30 magnetized in the direction of 135° with respect to the X direction. A magnetic flux in the direction of 135° with respect to the X direction is generated near each magnet 31 magnetized in the direction of −45° with respect to the X direction. A magnetic flux in the direction of 45° with respect to the X direction is generated near each magnet 32 magnetized in the direction of −135° with respect to the X direction. This is apparent when considering the directions of the magnetic fluxes around a magnet magnetized in a predetermined direction.

The magnets magnetized in the respective directions are arranged in a so-called Halbach array. A specific arrangement will be described hereinafter. The magnets 27 magnetized in the +Z direction align themselves in the X and Y directions at a period L, and in the directions inclined by 45° and −45° with respect to the X direction at a period √2×L. Magnets magnetized in the +Z direction and −Z direction alternately align themselves in directions inclined by 45° and −45° with respect to the X direction at every distance √2/2×L. Magnets magnetized in the directions inclined by 45° and −135° with respect to the X direction are alternately arranged, in the direction inclined by 45° with respect to the X direction, between magnets magnetized in the +Z direction and magnets magnetized in the −Z direction. Magnets magnetized in the directions inclined by −45° and 135° with respect to the X direction are alternately arranged, in the direction of −45° with respect to the X direction, between magnets magnetized in the +Z direction and magnets magnetized in the −Z direction.

Referring to FIG. 4B, in the space on the front side of the sheet surface of the magnet 28, the magnetic fluxes directed to the front side, that is, the magnetic fluxes in the −Z direction are reinforced as they are gathered in the four directions (directions inclined by ±45° and ±135° with respect to the X direction). In the space on the front side of the sheet surface of the magnet 27, the magnetic fluxes which run to the deep side of the sheet surface, that is, the magnetic fluxes in the +Z direction are reinforced as they are dispersed in the four directions. Conversely, on the surface on the deep side of the sheet surface of the magnet, that is, at the joint portion of the magnets and top plate 5, the magnetic fluxes cancel each other, so that the magnetic flux distribution becomes substantially zero.

When the arrangement of the magnets is seen along the X and Y directions, the magnets 27 to 32 align themselves in the X and Y directions each at the period L. Therefore, the magnets 27 to 32 are distributed such that their magnetic flux density in the vertical direction and that in the horizontal direction both form substantial sine curves with periods L along the X and Y directions, respectively. The magnetic flux density in the vertical direction and that in the horizontal direction are distributed with a shift of distance L/4. Assuming that the distance L is a 360° (2π) phase, the peak position of the magnetic flux density distribution in the vertical direction and that of the magnetic flux density distribution in the horizontal direction are phase shifted from each other by 90°.

Referring to FIG. 4B, non-magnetic portions 25, where no permanent magnets are provided, exist on the two end portions (the upper right corner and lower left corner of the top plate 5) of one diagonal on the lower surface of the top plate 5. Also, three linear non-magnetic portions 26 exist in each of the X and Y directions. As a result, fourteen small magnet units 33 each including a total of 33 magnets, i.e., four magnets magnetized in the +Z direction, four magnets magnetized in the −Z direction, nine magnets magnetized in the direction of −45° with respect to the X direction, six magnets magnetized in the direction of 45° with respect to the X direction, four magnets magnetized in the direction of 135° with respect to the X direction, and six magnets magnetized in the direction of −135° with respect to the X direction, are arranged on the lower surface of the top plate 5. When the magnet unit 6 includes small units in this manner, the movable element unit 1 can be made lightweight. Also, as the magnets are arranged such that they are asymmetric with respect to a straight line parallel to the X or Y direction, driving in the rotational direction is possible.

(Explanation of Driving Principle)

Figure 5:
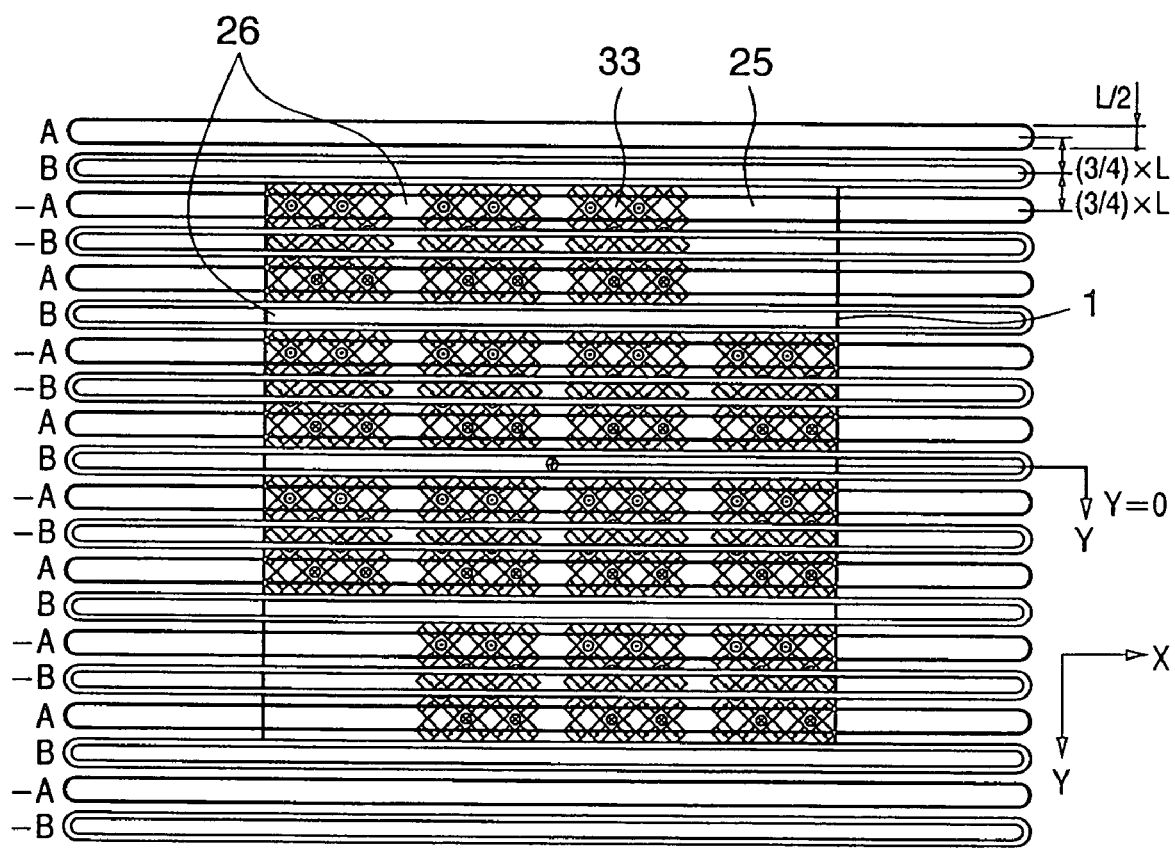
FIG. 5 is a view for explaining the relationship between the movable element unit and stator unit.

A principle of generating a horizontal force (propelling force) and a vertical force (levitating force) in the movable element unit 1 will be described with reference to FIG. 5. The straight portions of the coil are parallel to the X or Y direction. When a current is supplied to the coil in the horizontal (Z-direction) magnetic flux density, the Lorentz force generates a propelling force in the X or Y direction in the straight portions. When a current is supplied to the coil in a horizontal magnetic flux density, a levitating force in the Z direction or a force opposite to it is generated. FIG. 5 is a view of the coil array 12 and top plate 5 seen from the −Z direction. As described above, the coil array 12 is a layer including substantially elliptical coils each having straight portions in the X direction. The distance between the two straight lines (long sides) of each substantially elliptical coil is half the period L, that is, L/2, and adjacent substantially elliptical coils are separate from each other by ¾×L. Assuming the straight portions of a certain coil as a reference, when the period L is 360°, an adjacent coil is shifted from it by 270°, the next adjacent coil is shifted from it by 540° (180°), the still next coil is shifted from it by 810° (90°), and the still next coil has the same phase as 1,080° (0°). This phase pattern is repeated.

If every other coil is wound in the opposite direction or if current control is performed such that the current in the opposite direction is always supplied to every other coil, the coils can appear as coils having two types of phases, i.e., 0° and 90°. In FIG. 5, the current direction in every other coil is set in the opposite direction. A coil to which the opposite current is supplied is indicated by a "−" (minus) sign. Accordingly, the current flowing to the coils appears to include two phases, i.e., A phase and B phase. When the current is determined, the −A phase current and −B phase current are determined automatically.

As described above, each of the vertical magnetic flux density and horizontal magnetic flux density has a substantial sine wave distribution with the period L. When current control is performed such that a sine wave current having the same phase as that of the vertical magnetic flux density distribution is supplied to each coil, a propelling force proportional to the amplitude of the sine wave of the current is generated regardless of the position. More specifically, assuming that the position shown in FIG. 5 is Y=0, when the position of the movable element changes in the +Y direction, the currents of the respective phases are indicated by the following equations (1) to (4):

$$A \text{ phase current: } I_A = Ic \times \cos((Y/L) \times 2 \times \pi) \tag{1}$$

$$B \text{ phase current: } I_B = Ic \times \sin((Y/L) \times 2 \times \pi) \tag{2}$$

$$-A \text{ phase current: } I_{-A} = Ic \times \cos((Y/L) \times 2 \times \pi) \tag{3}$$

$$-B \text{ phase current: } I_{-B} = Ic \times \sin((Y/L) \times 2 \times \pi) \tag{4}$$

When the currents of (1) to (4) are respectively supplied, propelling forces in the ±Y directions with amounts proportional to Ic are generated regardless of the positions. The value of Ic is arbitrary.

When control is performed such that a current having the same phase as that of the horizontal magnetic flux density distribution is supplied to each coil, a substantially constant levitating force or a force opposite to it can be generated regardless of the position. More specifically, assuming that the position shown in FIG. 5 is Y=0, when the position of the movable element unit changes in the +Y direction, the currents of the respective phases are indicated by the following equations (5) to (8):

A phase current:

$$I_A = Ic \times \cos((Y/L) \times 2 \times \pi + (\pi/2)) \quad (5)$$
$$= Ic \times \sin((Y/L) \times 2 \times \pi)$$

B phase current:

$$I_B = Ic \times \sin((Y/L) \times 2 \times \pi + (\pi/2)) \quad (6)$$
$$= Ic \times \cos((Y/L) \times 2 \times \pi)$$

$$-A \text{ phase current } I_{-A} = Ic \times \sin((Y/L) \times 2 \times \pi) \quad (7)$$

$$-B \text{ phase current } I_{-B} = Ic \times \cos((Y/L) \times 2 \times \pi) \quad (8)$$

When the currents of (5) to (8) are respectively supplied, forces in the ±Z directions with amounts proportional to Ic are generated regardless of the positions. The value of Ic is also arbitrary.

As described above, in a coil layer including substantially elliptical coils having straight portions parallel to the X direction, forces with arbitrary magnitudes can be generated in the ±Y directions or ±Z directions. Similarly, in a coil layer (e.g., FIG. 3A) including substantially elliptical coils having straight portions parallel to the Y direction, forces with arbitrary magnitudes can be generated in the ±X directions or ±Z directions.

In practice, however, as described with reference to FIG. 4B, the magnet unit 6 is not arranged on the entire lower surface of the top plate 5 and has the linear non-magnetic portions 26. At the non-magnetic portions, when a current is supplied to the coils, no propelling force or levitating force is generated. Thus, current application is controlled so that no current is supplied to the non-magnetic portions 26. In other words, current control is performed to supply a current only to coils facing the magnets.

When the current is to be supplied to the coils facing the magnets, the number of A or −A phase coils and the number of B or −B phase coils are set to be equal. As described above, when control is performed such that a current having the same phase as that of the magnetic flux density distribution is supplied to the coils, a substantially constant propelling force or levitating force is obtained regardless of the position. This applies when the number of A or −A phase coils and the number of B or −B phase coils are equal. A method of turning on/off the coils will be described with reference to FIGS. 6A and 6B and FIGS. 7A and 7B.

Figure 6A:
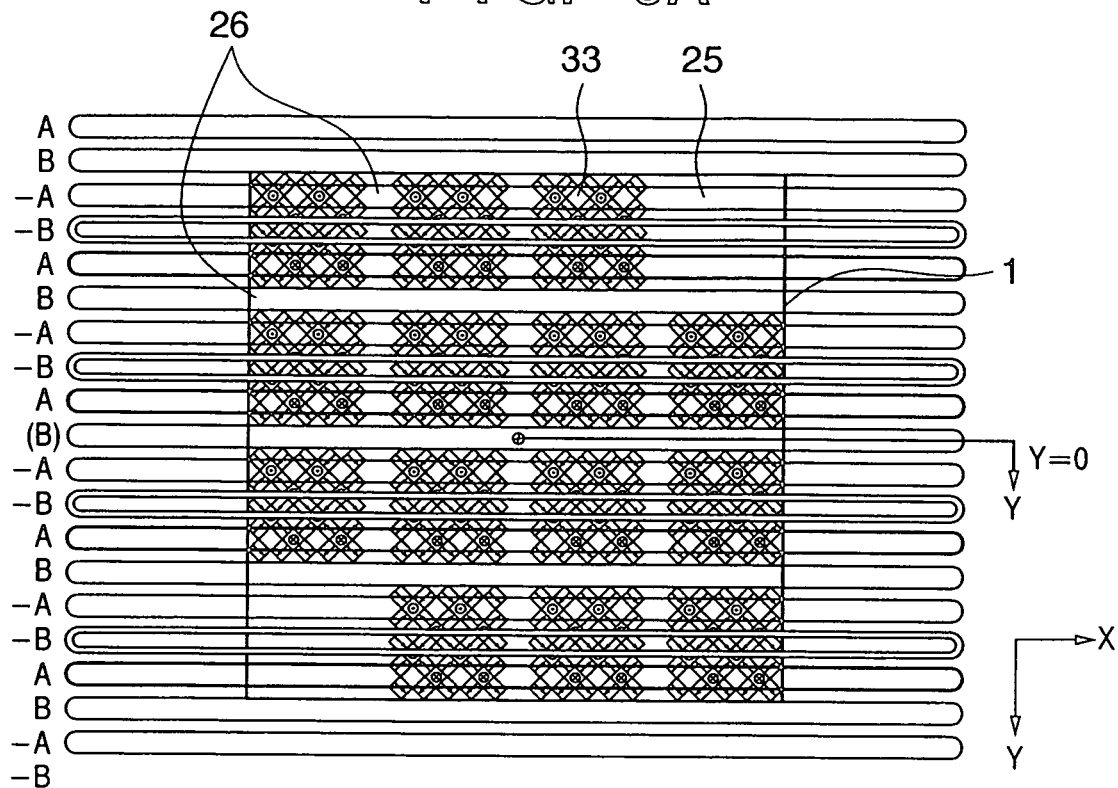
FIGS. 6A and 6B are views for explaining coil switching when generating a propelling force.
Figure 6B:
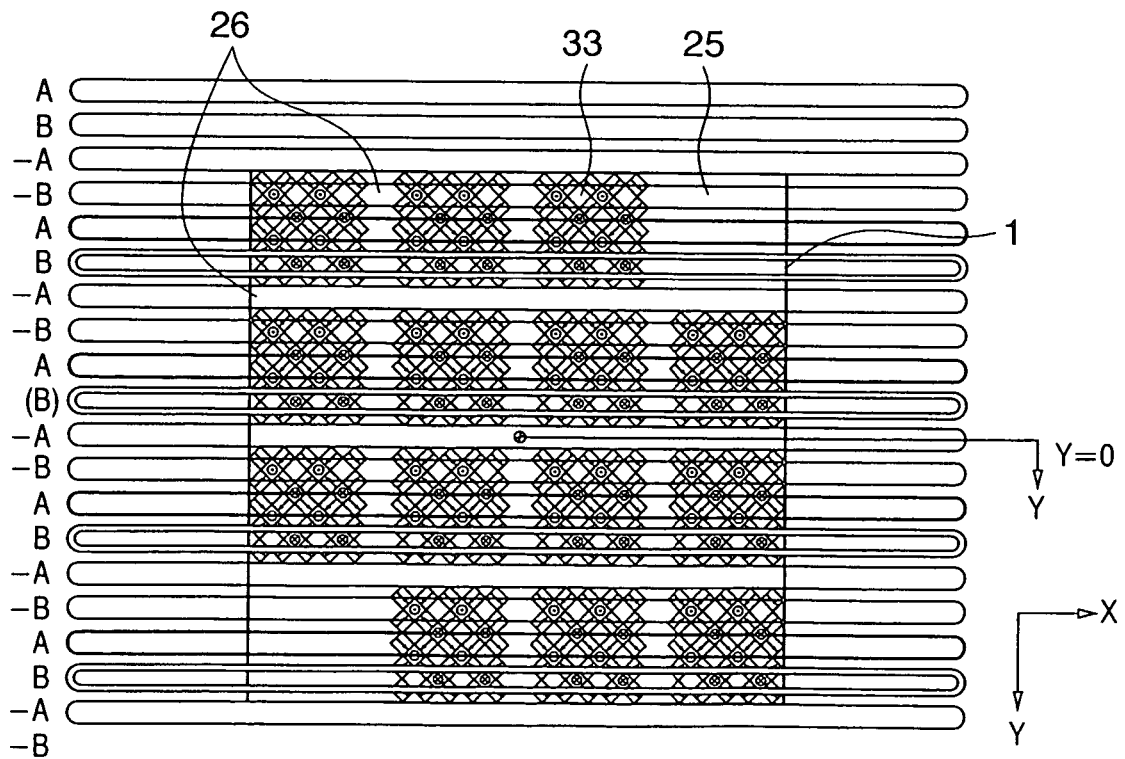

FIGS. 6A and 6B are views for explaining energization switching for a coil array that generates the propelling force. As shown in FIGS. 4A and 4B, fourteen small magnet units 33 each including thirty-three magnets are arranged on the lower surface of the top plate 5. The coils are turned on/off such that the A or −A phase coils and the B or −B phase coils in the same numbers act on the small magnet units. In FIGS. 6A and 6B, the coils are turned on/off such that the current flows to a total of two coils, i.e., one A or −A phase coil and one B or −B phase coil, of each small magnet unit.

FIGS. 6A and 6B are views aiming at how the movable element unit 1 moves in the +Y direction. The movable element unit 1 having moved in the +Y direction reaches the state of FIG. 6A and further moves in the +Y direction to reach the state of FIG. 6B. In FIGS. 6A and 6B, the coils that are turned on are indicated by double lines (the −B phase coils under the movable element unit 1 in FIGS. 6A and 6B) and thick solid lines (the A phase coils under the movable element unit 1 in FIGS. 6A and 6B), and the coils that are turned off are indicated by solid lines.

As described above, when a sine wave current complying with the position of the movable element unit 1 is applied to the coil such that the coil has the same phase as that of the vertical magnetic flux density distribution, a propelling force proportional to the sine wave amplitude can be generated. In the state of FIG. 6A, control is performed such that the currents of the B or −B phase coils the straight portions of which are immediately under the magnets magnetized in the ±Z directions are the maximum, and that the currents of the A or −A phase coils the straight portions of which are just at the middle of the magnets magnetized in the ±Z directions are zero. Note that the sine wave current is a current defined as a sine function, a cosine function, or a function having a harmonic component.

Until immediately before FIG. 6A, the −A and −B phase coils are ON. At the moment of FIG. 6A, the A phase coils are turned off and the A phase coils are turned on. In the state of FIG. 6A, the B phase coils located on the lower surface of the non-magnetic portions 26 are OFF, and coils that are not located on the lower surface of the movable element unit 1 are all OFF regardless of whether they are A, B, −A, or −B phase coils. In the state of FIG. 6B, the −B phase coils are turned off, and the B phase coils are turned on. After this, the on/off of each coil is switched at the moment the coil reaches the peak of the vertical magnetic flux density distribution (that is, the moment the current value supplied to the coil also reaches the peak and the current values of two adjacent coils having phases shifted by 90° become zero), so that two coils act on each small magnet unit. When current control is performed in this manner, while suppressing power consumption by a coil that does not contribute to the thrust, propelling forces in the ±Y directions proportional to the instructed value can be generated regardless of the position of the movable element unit 1. As the on/off of each coil is performed at a position where the current of the coil to be switched becomes zero, fluctuations in the thrust can be decreased.

Figure 7A:
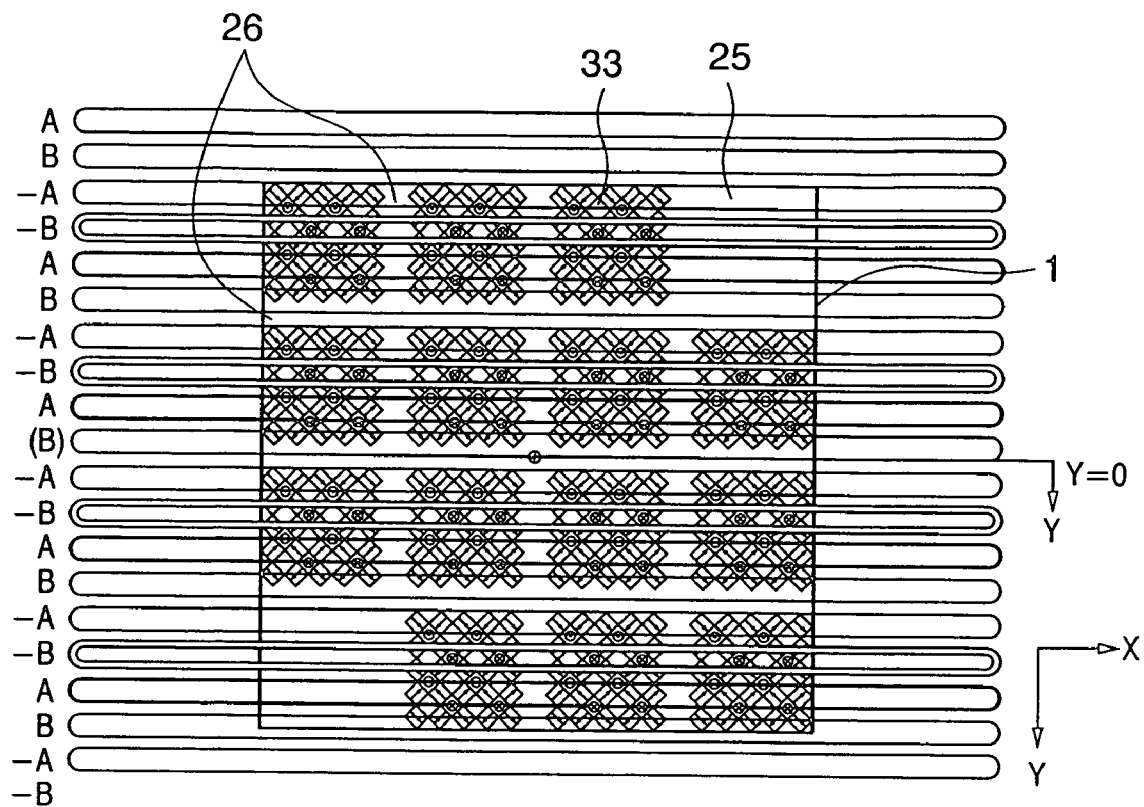
FIGS. 7A and 7B are views for explaining coil switching when generating a levitating force.
Figure 7B:
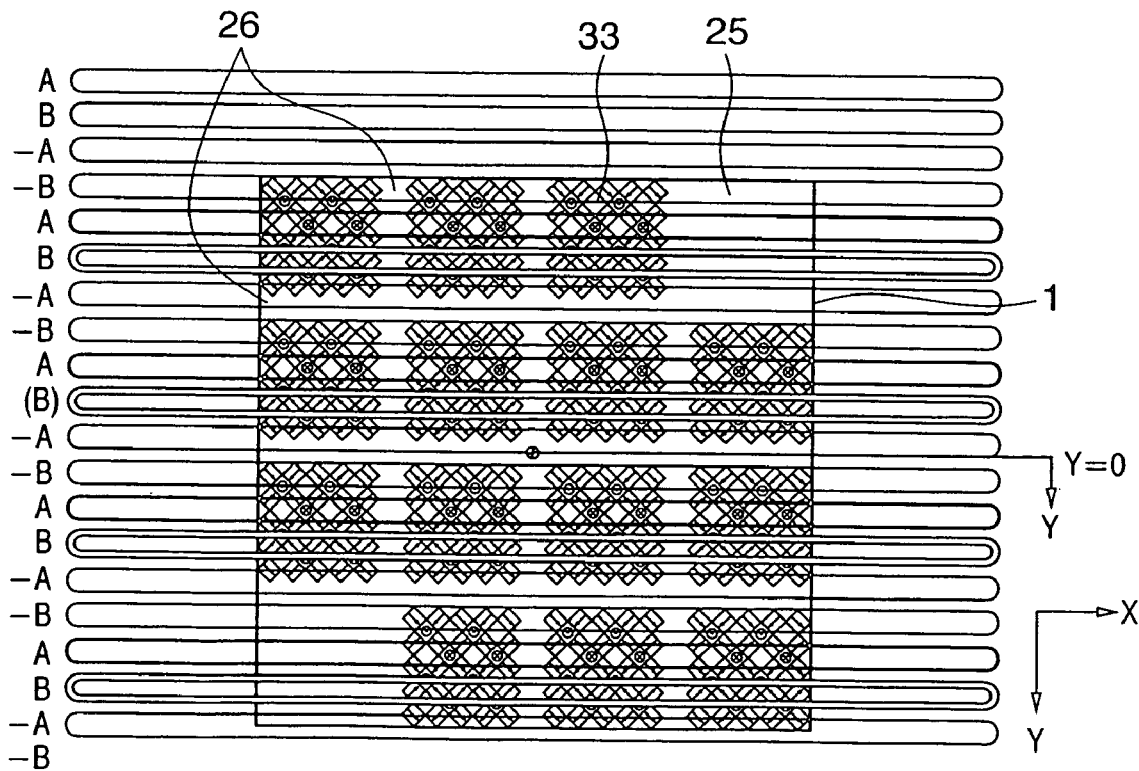

FIGS. 7A and 7B are views for explaining energization switching for a coil array that generates the levitating force. The movable element unit 1 having moved in the +Y direction reaches the state of FIG. 7A and further moves in the +Y direction to reach the state of FIG. 7B. The idea of switching is the same as that for the case of FIGS. 6A and 6B. Energization is switched such that one A or −A phase and one B or −B phase coil act on the small magnet unit. Note that the peak position of the magnetic flux distribution is different from that of FIGS. 6A and 6B and accordingly the coil switching position is different from that of FIGS. 6A and 6B.

If a propelling force is to be generated, the current is controlled to be zero when the coil straight portions are located just at the middle of a magnet magnetized in the Z direction and a magnet magnetized in the −Z direction. If a levitating force is to be generated, the current is controlled to be zero when the coil straight portions are located immediately under the magnets magnetized in the ±Z directions. In other words, the position to control the current to be zero differs, in connection with the relationship between the coil straight portions and the magnets magnetized in the ±Z directions, between the propelling force and levitating force by a L/4 period in the position in the Y-axis direction. When the on/off of the coils are switched at the position where the current becomes zero, fluctuations in the thrust can be decreased.

The above explanation applies when the coil straight portions extend parallel to the X-axis direction. The same explanation also applies when the coil straight portions extend in the Y direction. In this case, propelling forces in the ±X directions and levitating forces in the ±Z directions proportional to the instructed values can be generated regardless of the position.

The above description can lead to the conclusion that there are three layers of coil arrays that generate propelling forces in the ±X directions and forces in the ±Z directions and three layers of coil arrays that generate translating forces in the ±Y directions and forces in the ±Z directions. Accordingly, forces in directions of three degrees of freedom, i.e., X, Y, and Z directions, can be generated by any single one of the above layers or the combination of the above layers, so that the movable element unit 1 can be moved straight or rotated in the horizontal and vertical directions.

More specifically, as shown in FIG. 2, X-direction driving is mainly performed by the coil array 11 including substantially elliptical coils, which are the closest to the magnets and have straight portions parallel to the Y direction. Y-direction driving is mainly performed by the coil array 12 adjacent to the coil array 11 and including the substantially elliptical coils which have straight portions parallel to the X direction. Z-direction driving is mainly performed by the coil array 13 adjacent to the coil array 12 and including substantially elliptical coils which have straight portions parallel to the Y direction.

A method of generating a rotational moment about the Z-axis ($\omega z$ direction), X-axis ($\omega x$ direction), and Y-axis ($\omega y$ direction) will be described with reference to FIGS. 8 to 10.

FIG. 8 is a view for explaining generation of a moment about the Z-axis. In a layer including substantially elliptical coils having straight portions parallel to the X direction, of the magnets provided to the movable element unit 1, only those coil portions which face the non-magnetic portions 25 are energized, and coil energization is controlled such that propelling forces in opposite directions (forces in the +Y and −Y directions) are generated by these two coil portions. Due to the presence of the non-magnetic portions 25, the acting lines of the propelling forces in the opposite directions are shifted in the X direction, so that a moment about the Z axis can be generated. Specifically, the moment about the Z axis can be generated by using the coil array 14 shown in FIG. 2. The current control method and switching method for the coils are the same as those described above, and a description thereof will be omitted.

FIG. 9 is a view for explaining generation of a moment about the X-axis. In a layer including substantially elliptical coils having straight portions parallel to the X direction, only the coil portions which face eight small magnet units at the center having no non-magnetic portions 25 are driven to generate forces in the ±Z directions. Energization to the coils is controlled to generate a force in the Z direction that acts in the opposite directions through a center line G of the movable element as a boundary. At positions shifted from the center line G in the Y direction, forces in the opposite Z directions form a moment that rotates the movable element unit 1 about the X-axis. Specifically, the moment about the X-axis can be generated by using the coil array 16 shown in FIG. 2.

Figure 10:
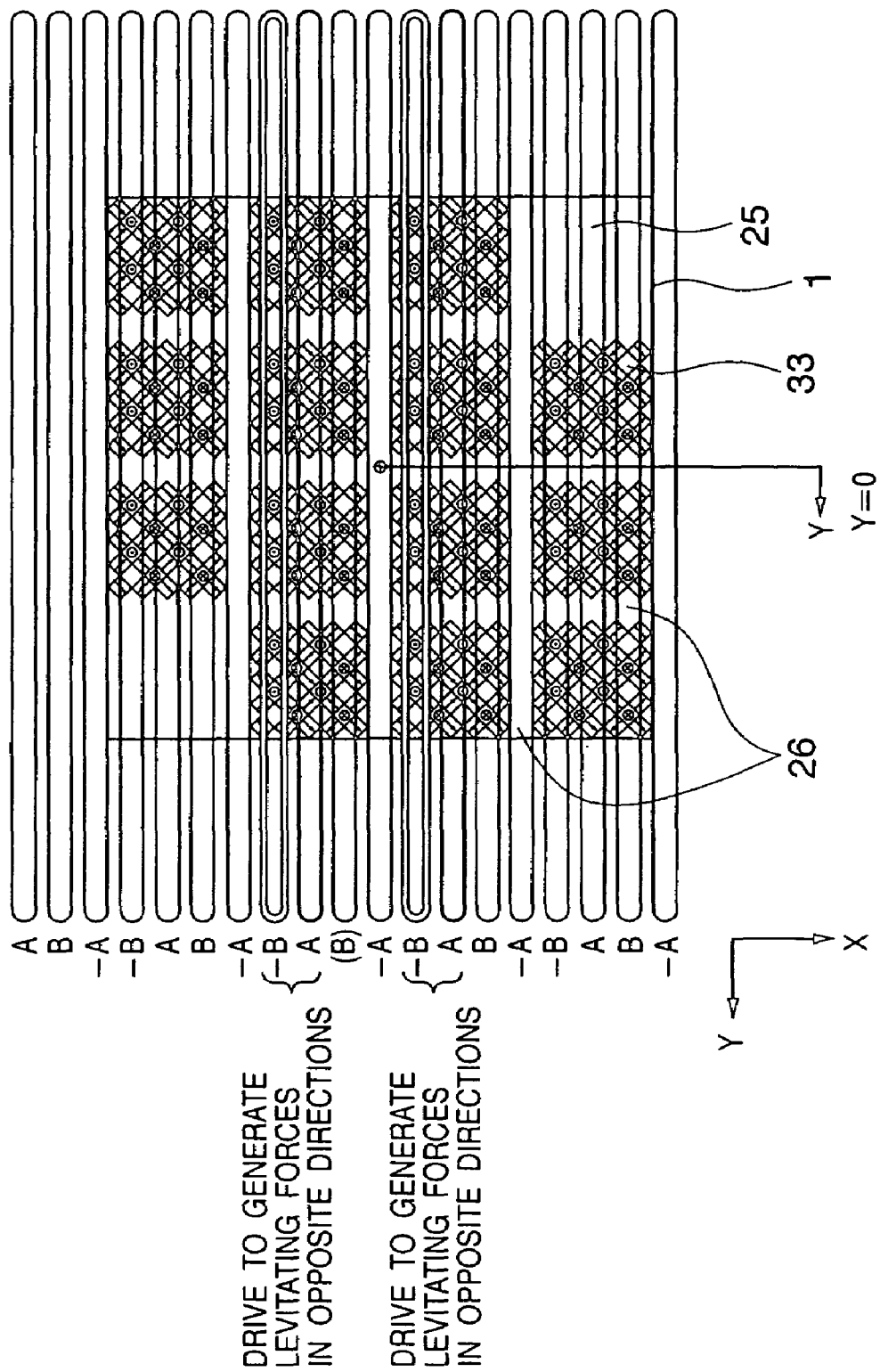
FIG. 10 is a view for explaining driving in an ωy direction.

FIG. 10 is a view for explaining generation of a moment about the Y-axis. In a layer including substantially elliptical coils having straight portions parallel to the Y direction, only the coil portions which face eight small magnet units at the center having no non-magnetic portions are driven to generate forces in the ±Z directions. Energization to the coils is controlled to generate a force in the Z direction that acts in the opposite directions through the center line G of the movable element as a boundary. At positions shifted from the center line G in the X direction, forces in the opposite Z directions form a moment that rotates the movable element unit 1 about the Y-axis. Specifically, the moment about the Y-axis can be generated by using the coil array 15 shown in FIG. 2.

The forces in the six-axis directions are proportional to the current, and can insulate vibration between the movable element unit and stator unit.

As described above, when a plane motor is formed of the top plate 5, the movable element unit 1 having the magnet unit 6 arranged asymmetrically with the top plate 5, and the stator unit 2 obtained by fixing to a base a plurality of coil layers each including substantially elliptical coils having straight portions parallel to the X or Y directions, the Lorentz forces in directions of six degrees of freedom can be applied to the movable element unit 1 formed of the top plate 5 and magnets. When the position of the movable element unit 1 is measured by a position measuring means (not shown) for measuring the directions of six degrees of freedom and position control is performed such that the movable element unit 1 is located at a desired position, highly accurate position control can be performed.

As described above, the weight of the movable element unit 1 is almost canceled by the attracting force of the permanent magnets 8. Thus, substantially no Lorentz force in the Z direction need be generated, and only a small current for correcting a small positional shift flows. As the coils of the stator unit have no magnetic cores, cogging can be decreased. As a result, coil heat generation can be largely decreased.

In this embodiment, bipolar magnets are arranged at the four corners of the top plate 5 of the movable element unit 1. This is merely a design example, and the number of magnets and the number of poles are not particularly limited. It suffices as far as permanent magnets are arranged on the upper portion of the movable element, a magnetic member is arranged to face the permanent magnets, and the movable element unit 1 receives a vertically upward attracting force from the attracting plate.

(Modification of Stator Unit)

Figure 11A:
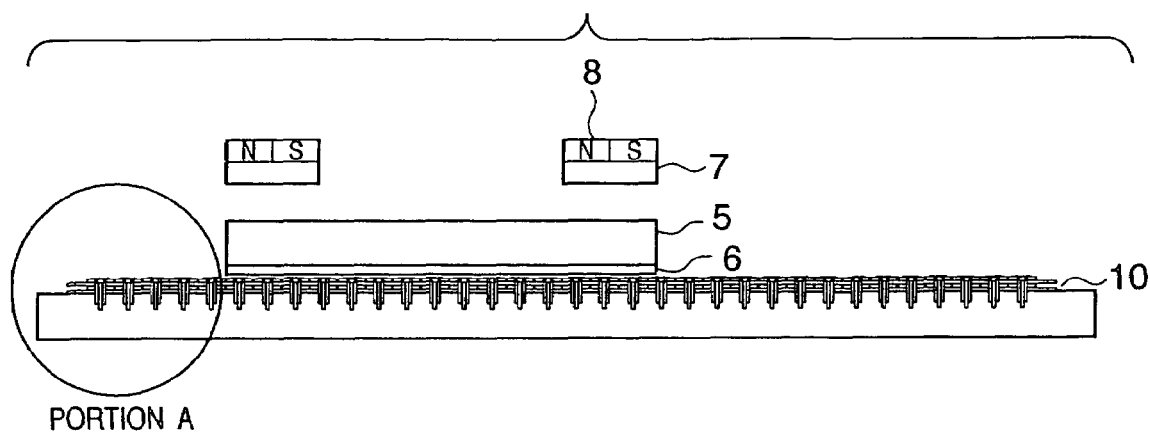
FIGS. 11A and 11B are views showing a four layer coil.
Figure 11B:
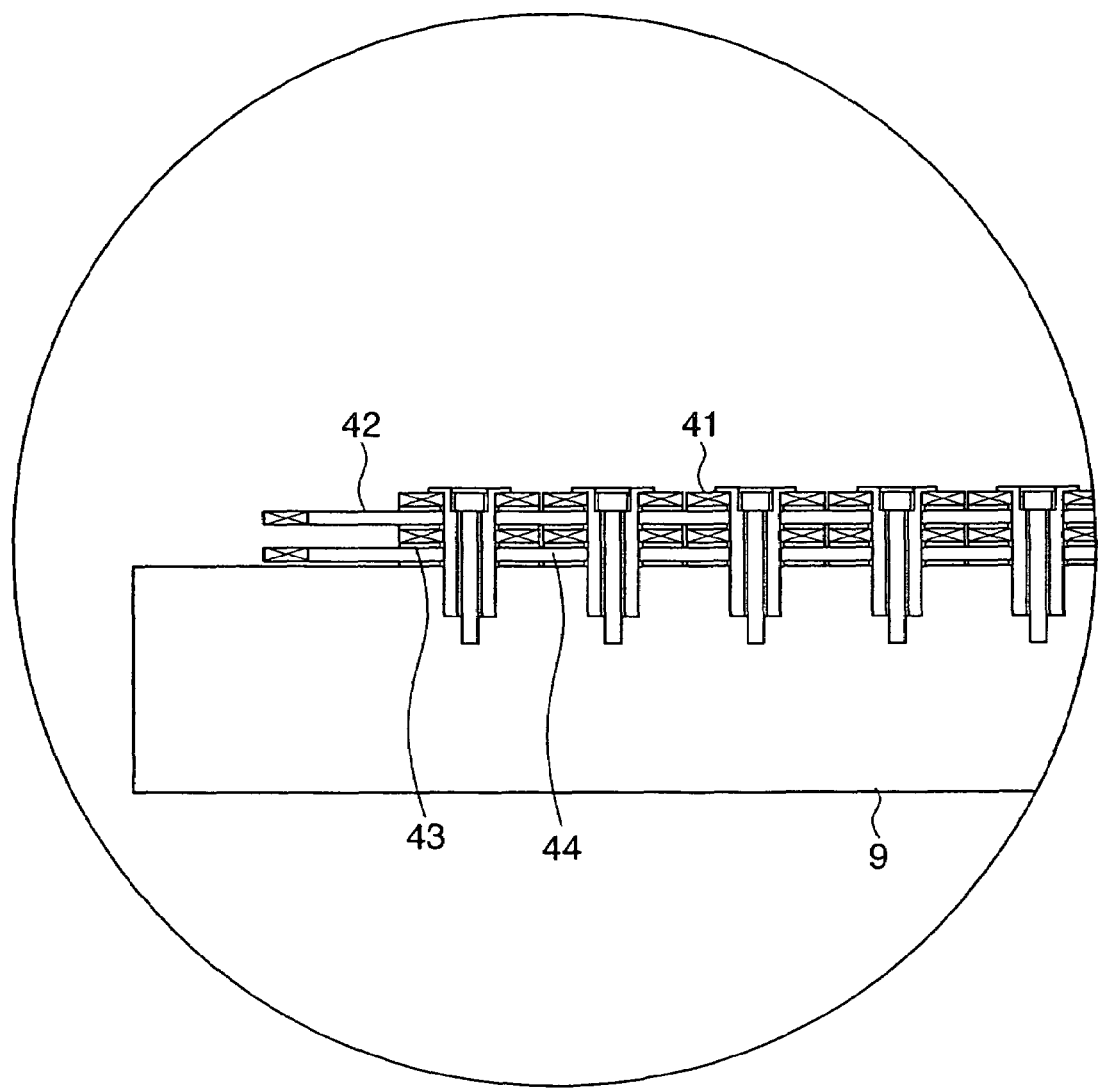

FIGS. 11A and 11B are views showing a modification in which the stator unit has four coil layers. The movable element unit and attracting plate are the same as those of the first embodiment. The stator unit has two layers each including substantially elliptical coils having straight portions parallel to the X direction, and two layers each including substantially elliptical coils having straight portions parallel to the Y direction, leading to a total of four layers. In the first embodiment, a layer that generates forces in directions of six degrees of freedom is provided separately. In this modification, the stator unit includes four layers each of which generates forces in directions of two degrees of freedom.

Figure 12:
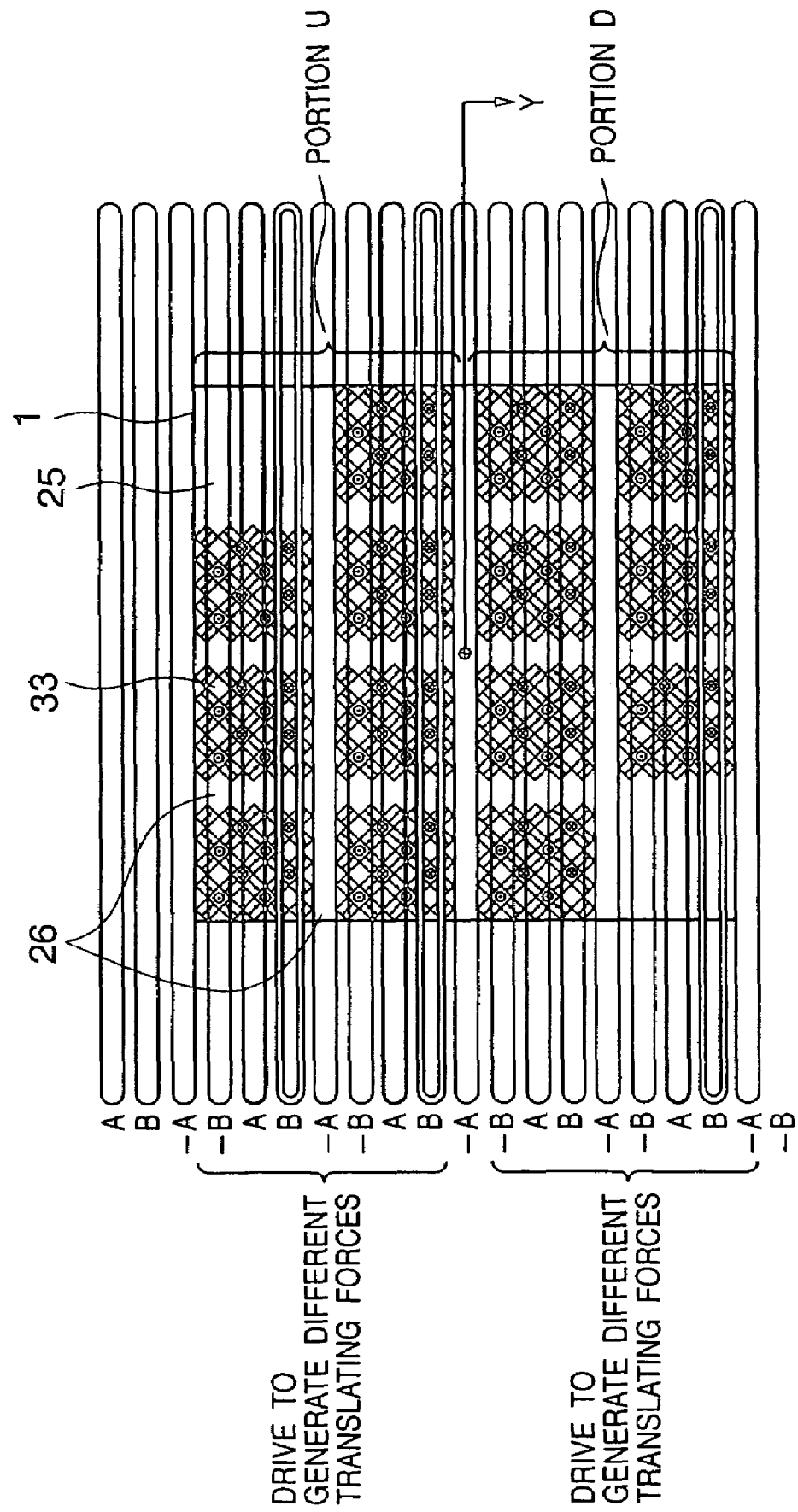
FIG. 12 is a view for explaining driving in a Y direction and the ωz direction in the four layer coil.

FIG. 12 is a view for explaining driving in the Y direction and driving in the $\omega z$ direction. In a coil layer (e.g., a coil array 42 of FIG. 11B) including substantially elliptical coils having straight portions parallel to the X direction, only coils that face a movable stage 1 are driven, and the current is controlled such that different translating forces are generated by the upper half (portion U) and lower half (portion D) in FIG. 12 with respect to a line segment extending through the Y direction center of the movable stage 1. The sum of the force generated by the upper half and the force generated by the lower half forms translating forces in the Y direction. As the acting line of the force in the Y direction generated by the upper half and the acting line of the force in the Y direction generated by the lower half are shifted from each other in the X direction, the difference between the forces generated by the upper and lower halves acts as a moment in the ωz direction.

Figure 14:
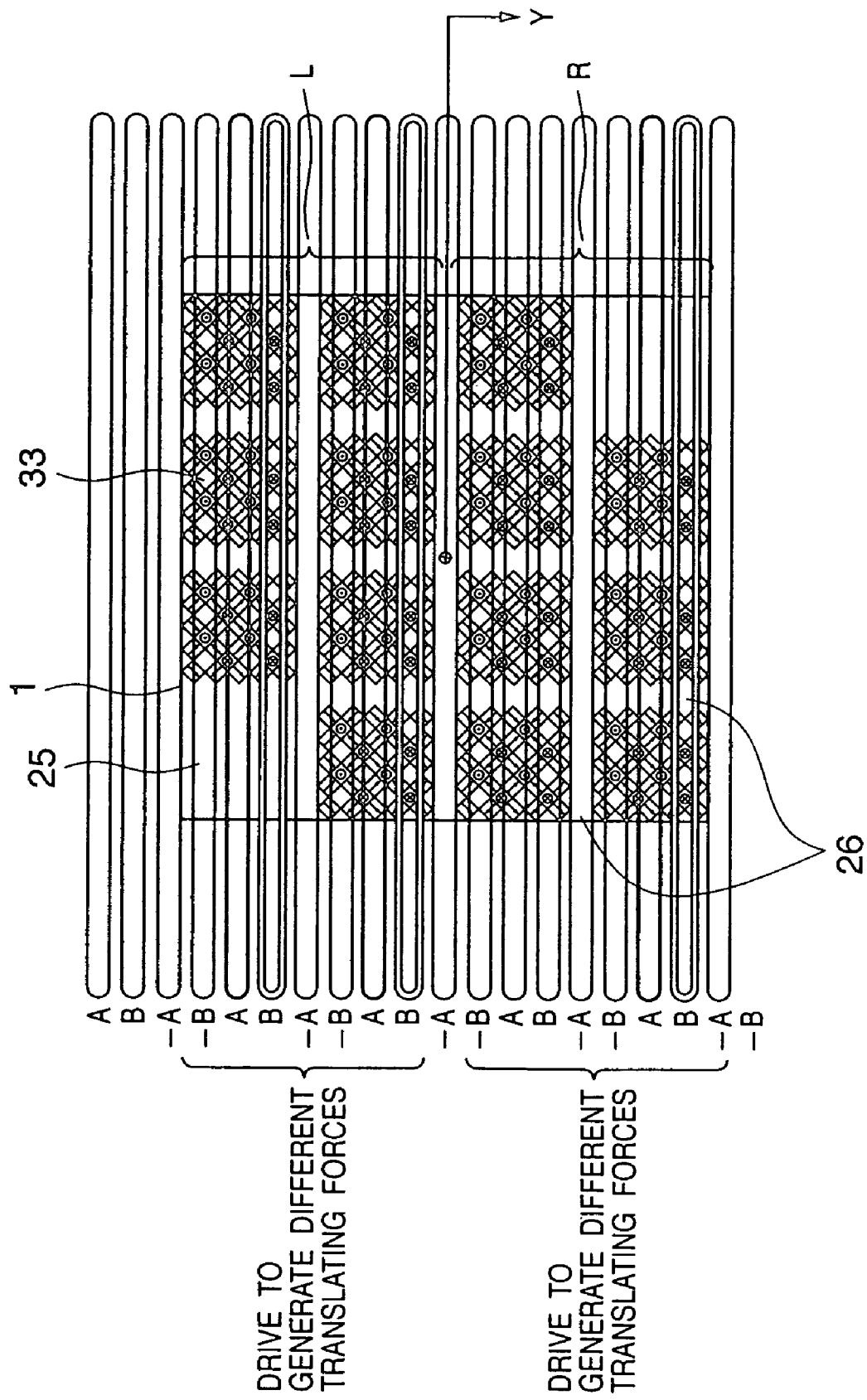
FIG. 14 is a view for explaining driving in an X direction and the ωz direction in the four layer coil.

FIG. 14 is a view for explaining driving in the X direction and driving in the ωz direction. In a coil layer (e.g., a coil array 41 of FIG. 11B) including substantially elliptical coils having straight portions parallel to the Y direction, only coils that face the movable stage 1 are driven, and the current is controlled such that different translating forces are generated by the right half (portion R) and left half (portion L) in FIG. 14 with respect to a line segment extending through the X-direction center of the movable stage 1. The sum of the force generated by the right half and the force generated by the left half forms translating forces in the X direction. As the acting line of the force in the Y direction generated by the right half and the acting line of the force in the X direction generated by the left half are shifted from each other in the Y direction, the difference between the forces generated by the right and left halves acts as a moment in the ωz direction.

Figure 13:
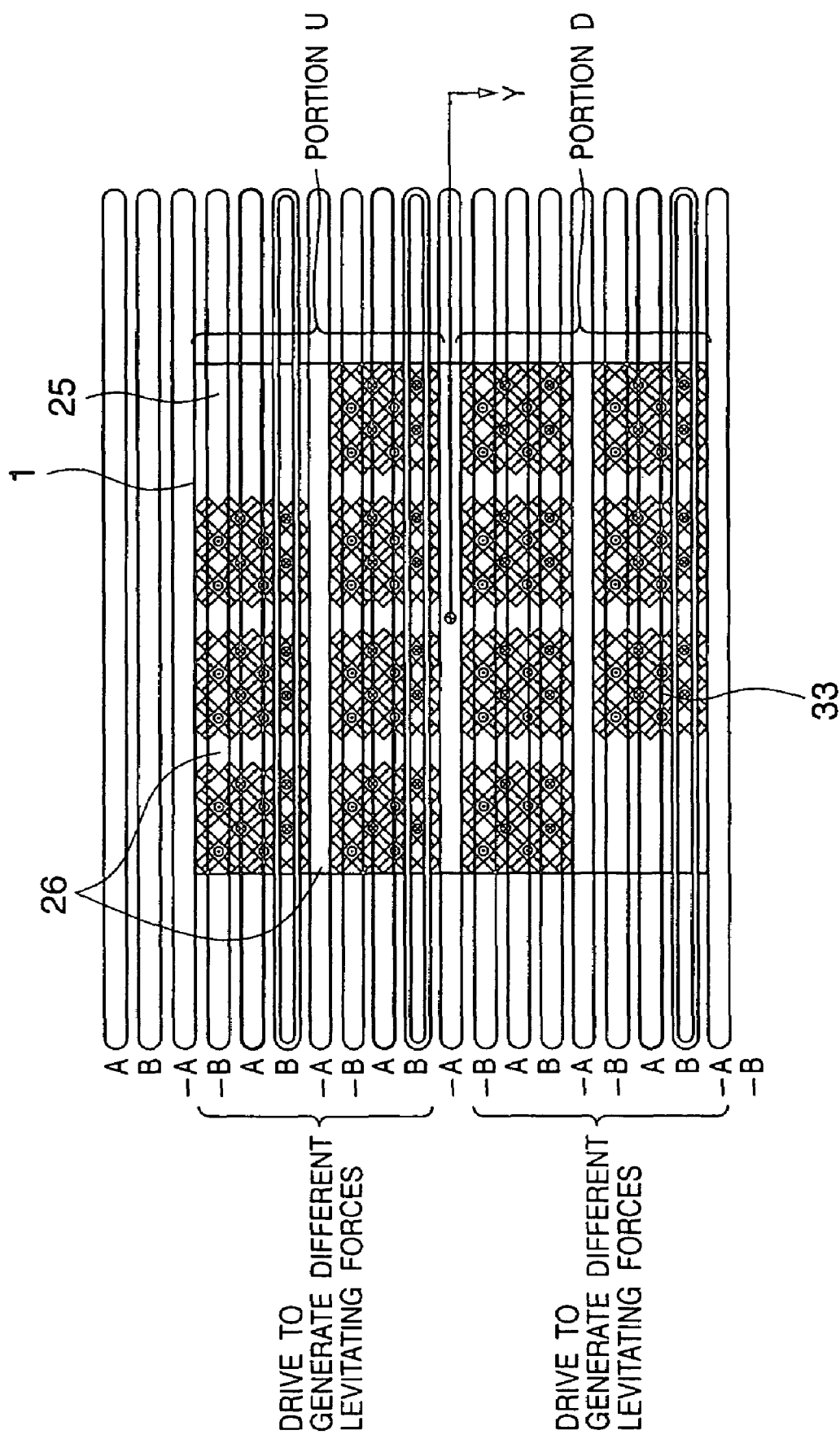
FIG. 13 is a view for explaining driving in a Z direction and the ωx direction in the four layer coil.

FIG. 13 is a view for explaining driving in the Z direction and driving in the ωx direction. In a coil layer (e.g., a coil array 44 of FIG. 11B) including substantially elliptical coils having straight portions parallel to the X direction, only coils that face the movable stage 1 are driven, and the current is controlled such that different Z-direction levitating forces are generated by the upper half (portion U) and lower half (portion D) in FIG. 13 of the movable stage 1. The sum of the force in the Z direction generated by the upper half and the force in the Z direction generated by the lower half forms levitating forces to act on the movable element. As the acting line of the force generated by the upper half and the acting line of the force generated by the lower half are shifted from each other in the Y direction, the difference between the forces generated by the upper and lower halves acts as a moment in the ωx direction.

FIG. 15 is a view for explaining driving in the Z direction and driving in the ωy direction. In a coil layer (e.g., a coil array 43 of FIG. 11B) including substantially elliptical coils having straight portions parallel to the Y direction, only coils that face the movable stage 1 are driven, and the current is controlled such that different Z-direction levitating forces are generated by the right half (portion R) and left half (portion L) in FIG. 15 of the movable stage 1. The sum of the force in the Z direction generated by the right half and the force in the Z direction generated by the left half forms levitating forces to act on the movable stage 1. As the acting line of the force generated by the right half and the acting line of the force generated by the left half are shifted from each other in the X direction, the difference between the forces generated by the right and left halves acts as a moment in the ωy direction.

With the arrangement of this modification, the number of coil layers can be decreased. From another point of view, the coil sectional area per layer can be increased, and, accordingly, the resistance of the coils is decreased and heat generated by the coils is decreased. Although the number of coil layers is four and six in the above description, the present invention is not limited to them.

Second Embodiment

Figure 16A:
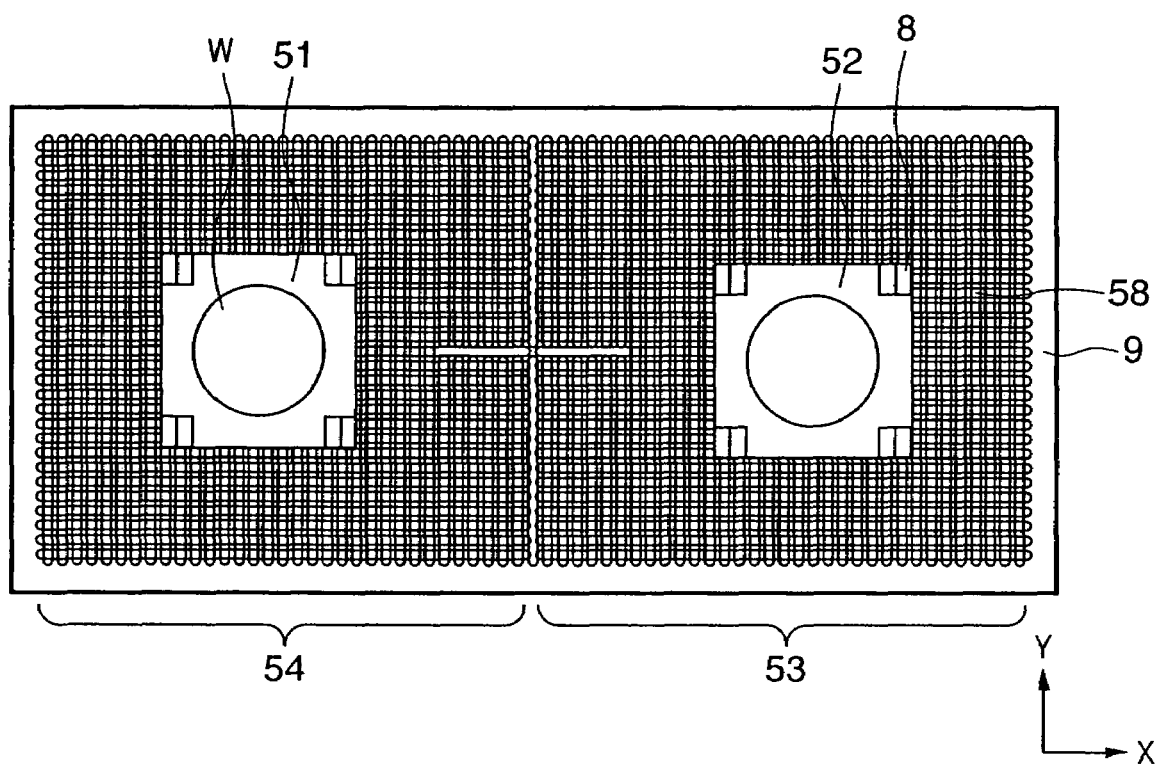
FIGS. 16A and 16B are views for explaining a structure having two movable element units.
Figure 16B:
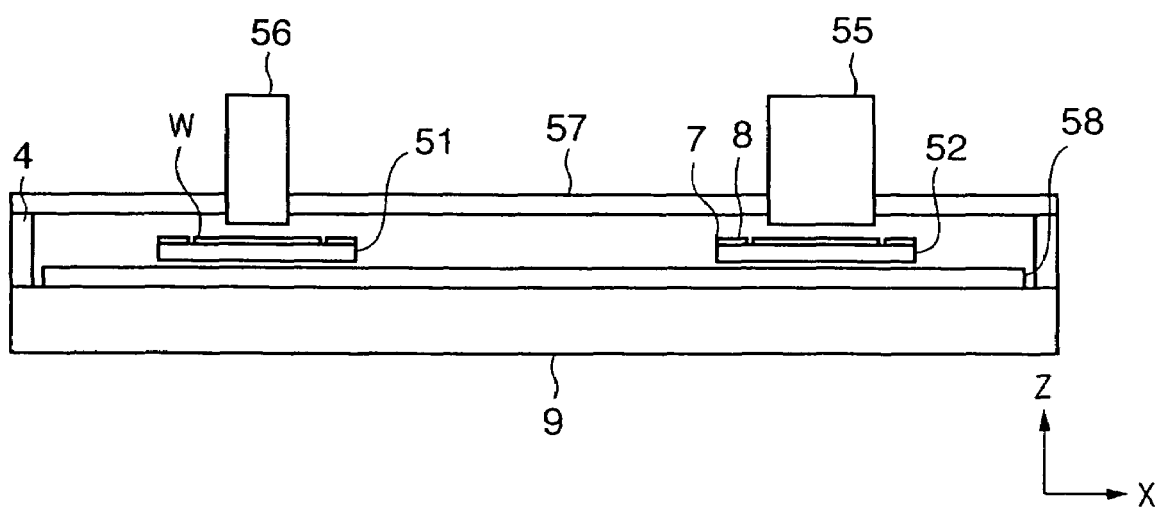

FIGS. 16A and 16B show the second embodiment. In the first embodiment, one movable unit is provided. In the second embodiment, two movable units are provided. The arrangement having two movable units in this manner attracts attention in recent years as a wafer stage used in an exposure apparatus. When exposure operation of exposing a pattern onto a wafer and measurement (alignment) operation of measuring the position of the pattern exposed the last time are performed simultaneously, an increase in throughput can be expected.

FIG. 16A is a view of movable stages 51 and 52 seen from the Z-axis direction. The two movable stages 51 and 52 can move in a measurement region 54 and exposure region 53, respectively. A projection optical unit 55, e.g., a projection lens, which exposes the pattern of the wafer mounted on the movable element is arranged above the exposure region 53. A measurement optical unit 56, e.g., an off-axis scope, which measures the position of the exposed pattern is arranged above the measurement region 54.

The operation will be described briefly. A wafer W transported from a transport system (not shown) is mounted on the movable stage 51 located within the measurement region 54. The position of the pattern on the mounted wafer, which is exposed the last time, is measured by using the measurement optical unit 56 in the measurement region 54. The movable stage 51 subjected to the measuring operation moves to the exposure region 53. At this time, the movable stage 52 located within the exposure region 53 moves to the measurement region 54 not to come into contact with the movable stage 51 (see FIGS. 19A and 19B). Exposure operation takes place on the movable stage 51 having moved to the exposure region 53 by using the projection optical unit 55. At this time, the next wafer W transported from the transport system is mounted on the movable stage 52, having moved to the measurement region 54, in the measurement region 54, and the position of the pattern exposed the last time is measured by using the measurement optical unit 56. The movable stage 51 where the exposure operation takes place moves to the measurement region 54. The wafer W on the movable stage 51 is recovered by a recovery device (not shown), and a new transported wafer is mounted on the movable stage 51. At this time, the movable stage 52 where the measurement operation has been performed moves to the exposure region 53. After that, the same operations are repeated.

As the movable stages 51 and 52 are identical to those in the first embodiment, their description will be omitted. An attracting plate 57 is arranged above the movable stages 51 and 52 to cover their moving range to cancel the weights of the movable stages 51 and 52. The attracting plate 57 has openings at portions where the exposure optical unit 55 and measurement optical unit 56 are provided. The attracting plate 57 can be divided into the exposure region 53 and measurement region 54.

A stator unit 58 according to the second embodiment will be described with reference to FIGS. 18A and 18B. In the same manner as in the first embodiment, the stator unit 58 has four or six coil layers each including substantially elliptical coils. Note that in the second embodiment, the two movable stages 51 and 52 must be interchangeable between the exposure region 53 and measurement region 54. A mechanism for achieving this will be described hereinafter.

Figure 18A:
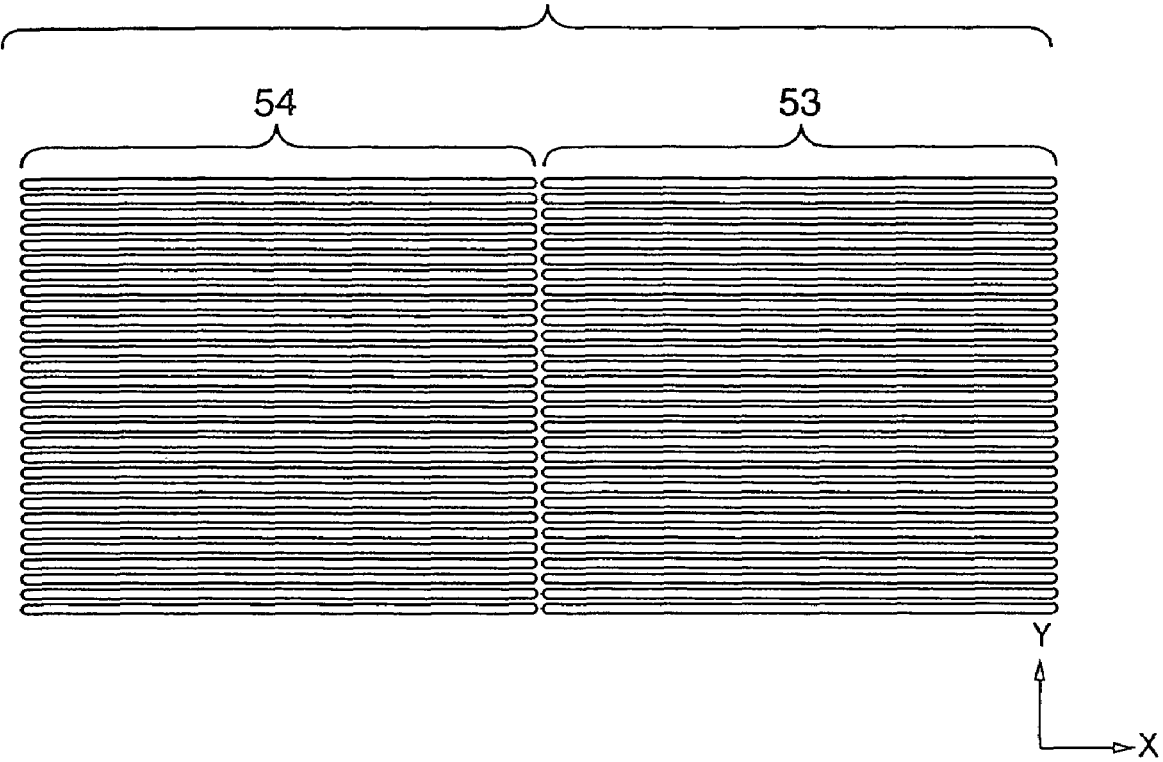
FIGS. 18A and 18B are views for explaining a stator unit according to the second embodiment.

As shown in FIG. 18A, the layer including the substantially elliptical coils having straight portions parallel to the X direction is halved into left and right portions. As the coil layer is halved into the exposure region and measurement region in this manner, the two movable stages are located in the exposure region 53 and measurement region 54. Even when the two movable stages are aligned on one straight line parallel to the X direction, the forces in six-axis directions of each movable stage can be controlled independently. Conversely, if the coil layer is not halved, when the two movable stages are aligned on one straight line parallel to the X direction, the substantially elliptical coils having the straight lines parallel to the X direction are shared between the two movable stages.

Then, the forces generated by the substantially elliptical coils having the straight portions parallel to the X direction cannot be controlled independently for each movable stage, and, accordingly, the forces in the six-axis directions of each movable stage cannot be controlled independently. In other words, what matters is that when the two movable stages are located on one straight line parallel to the X direction, the forces in the six-axis directions of each of the two movable stages must be controllable independently. The dividing boundary can be freely designed within a range that can achieve this object. This structure is necessary when the movable stages are to be moved in the exposure region 53 and measurement region 54 independently of each other.

Figure 18B:
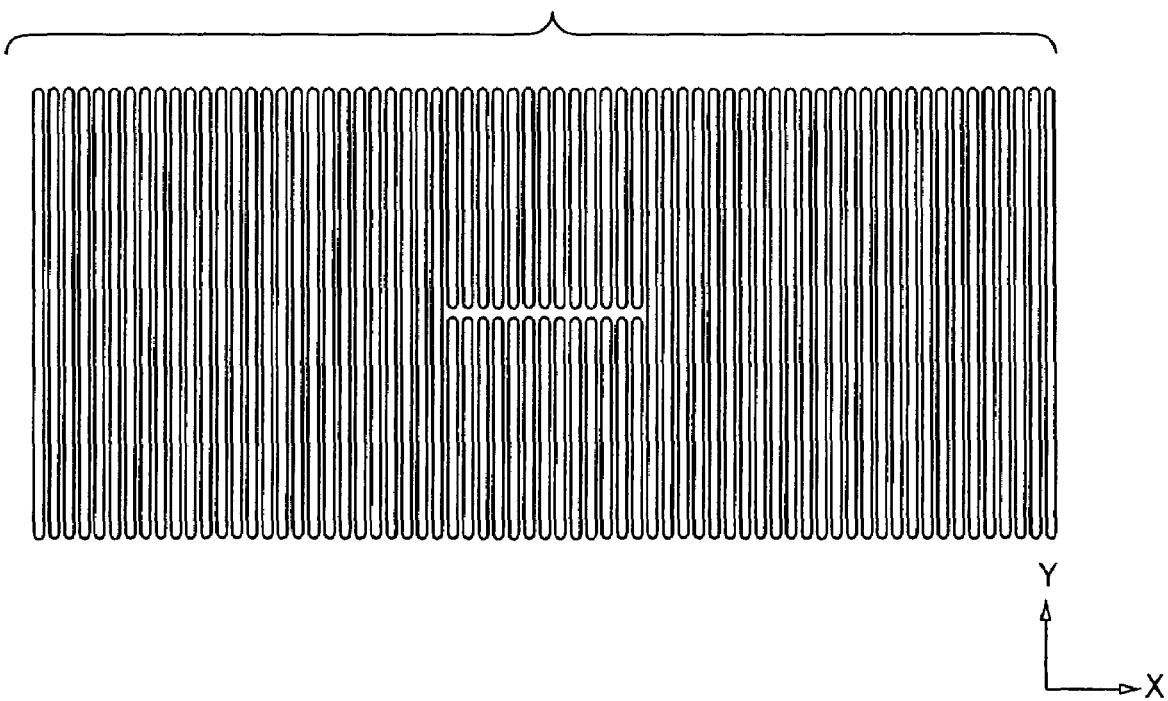

As shown in FIG. 18B, in the layer including the substantially elliptical coils having straight portions parallel to the Y direction, the substantially elliptical coils are divided in the Y direction at a portion in the vicinity of the dividing boundary of the layer, described above, including the substantially elliptical coils having the straight portions parallel to the X direction, that is, at a portion in the vicinity of the boundary of the exposure region 53 and measurement region 54. The dividing boundary of the substantially elliptical coils is located on, e.g., a straight line that connects an exposure position and a measurement position. What matters here is that when the two movable stages are located on one straight line parallel to the Y direction, the forces in the six-axis directions of each of the two movable stages must be controllable independently. The dividing boundary can be freely designed within a range that can achieve this object. This structure is necessary when the movable stages are to be interchanged between the exposure region 53 and measurement region 54.

Figure 20:
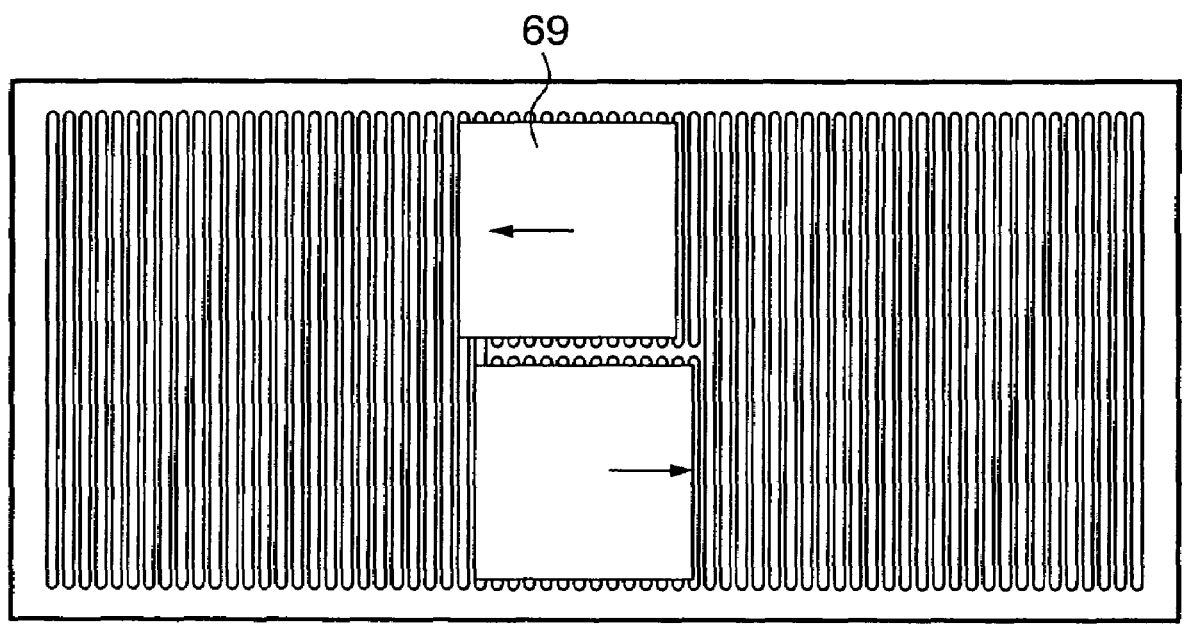
FIG. 20 is a view showing how the stages cannot be controlled individually during stage interchange.

With the above structure, the movable stages as shown in FIGS. 19A and 19B are interchanged. At this time, the two movable stages should not be aligned at an X position outside the dividing boundary. This is because if the movable stages 51 and 52 are aligned on a substantially elliptical coil as shown in FIG. 20, they cannot be controlled independently. As a means for preventing this, for example, the divisional region may be formed larger than the X-direction width of each movable stage, or the two movable stages are controlled such that they can meet each other with a rotationally symmetric positional relationship with respect to the X-direction center of the divisional region.

(Modification of Attracting Plate)

FIGS. 17A to 17C show modifications of the attracting plate. More specifically, in FIGS. 17A to 17C, the attracting plate 57 of FIG. 16B is modified to have a stacked layer structure. In FIGS. 17B and 17C, an attracting plate 67 is formed by stacking in the X direction thin plates extending along a Y-Z plane, and is arranged through supports. The effect of the stacked layer structure will be described hereinafter.

In FIG. 16B, the attracting plate 57 is made of a magnetic material, generally, a conductor, to generate an attracting force together with the permanent magnets 8 on the two movable stages. With this structure, magnetic fluxes generated by the permanent magnets pass through the attracting plate 57. When the movable stages 51 and 52 provided with the permanent magnets 8 move with respect to the attracting plate 57, an eddy current is undesirably generated in the attracting plate 57 in an attempt to cancel a change in magnetic fluxes. The eddy current exerts a viscous force to the movable stages in the horizontal direction to increase heat generation by the coils for driving.

According to the above explanation of the driving principle, when sine wave control is performed such that a current having the same phase as that of the vertical magnetic flux density distribution is supplied to each coil, a propelling force proportional to the sine wave amplitude of the current is generated regardless of the position. In practice, however, the magnetic flux density distribution is slightly shifted from a substantial sine wave, and, accordingly, the propelling force does not become constant, but a force including pulsation is generated. When a movable stage is driven at a constant speed, a driving force is not originally required, and, accordingly, a pulsation component does not largely influence the movable stage. When, however, a viscous force is generated by the eddy current as described above, a force against the viscous force must be generated. Then, even when the movable stage is to be driven at a constant speed, a pulsation component becomes apparent to serve as a disturbance that decreases the accuracy of position control.

In view of this, as shown in FIGS. 17B and 17C, the attracting plate 67 has a stacked layer structure including thin plates, so that the electrical resistance is equivalently increased with respect to the eddy current which is to flow, thus decreasing the value of the eddy current. Then, the viscous force decreases to decrease an increase in coil heat generation. The pulsation component of the force characteristics is also decreased to improve the control accuracy.

In FIGS. 17B and 17C, the attracting plate 67 is formed by stacking in the X direction the thin plates extending along the Y-Z plane. In this case, the permanent magnets on each movable stage are preferably arranged such that their N and S poles are arrayed in the Y direction as shown in FIG. 17B. As the magnetic flux circulates from the N pole to the S pole, the magnetic flux obtained with this arrangement mainly includes only a Z-direction component and a Y-direction component. When the movable stage moves in the Y direction, the Z-direction component and Y-direction component of the magnetic flux change, and an eddy current about the Z-axis and an eddy current about the Y-axis are to be generated. Since the attracting plate 67 is formed by stacking the thin plates extending along the Y-Z plane, a resistance against the eddy current about the Z-axis and a resistance against the eddy current about the Y-axis are large. In other words, the structure of FIG. 17B can effectively decrease an eddy current generated when the movable stage moves in the Y direction.

Alternatively, the attracting plate 67 can be formed by stacking in the Y direction thin plates extending in the X-Z direction. In this case, when the permanent magnets 8 on the movable stage are arranged such that their N and S poles are arrayed in the Y direction, the eddy current, which is generated when the movable stage moves in the X direction by the above reason, can be decreased effectively.

FIG. 17C shows a structure in which a nonmagnetic and/or an insulating cover 68 is provided under the stacked attracting plate 67. When the permanent magnets 8 on the movable stage and the attracting plate 67 attract each other, a very large attracting force acts, and to separate the permanent magnets 8 and attracting plate 67 from each other is very difficult. The cover 68 is provided to prevent attraction of the permanent magnets 8 and attracting plate 67 to each other. When the cover 68 is made of a nonmagnetic material, a situation magnetically equivalent to air is created, so that an adverse influence of magnetism is eliminated. When the cover 68 is made of an insulator, an adverse influence of the eddy current is suppressed.

A large gap may be designed between the permanent magnets 8 on the movable stage and the attracting plate 67, so that the movable stage is not sensitive to fluctuations of the attracting plate 68 in the Z direction. If a large gap cannot be formed due to some reason, a cover 68 slightly thinner than the gap is desirably provided between the permanent magnets 8 and attracting plate 67. With this structure, even if control becomes impossible and the permanent magnets 8 are attracted to the attracting plate 67, as the difference between the weight of the movable stage and the attracting force is small, the permanent magnets 8 can be restored by supplying a current to the stationary unit.

Thin plates or tapes having a small coefficient of friction can be provided on the permanent magnets 8, or a rolling means such as a cam follower may be provided between the movable stage and the attracting plate 67. Then, when the permanent magnets 8 are attracted to the attracting plate 67, the permanent magnets 8 and cover 68 do not come into direct contact with each other, so that damage or the like to the permanent magnets 8 can be prevented. When a current is supplied to the coils of the stator unit 2 while the permanent magnets 8 are kept attracted to the cover 68, the movable stage can be moved in the horizontal direction and brought to a desired position.

The examples of the attracting plates having the stacked layer structure and covers described above are not limited to a case wherein two movable stages are provided but can also be naturally applied to a case wherein one movable stage is provided, and to any other modification.

(Modification of Magnet Arrangement of Movable Stage)

Figure 21A:
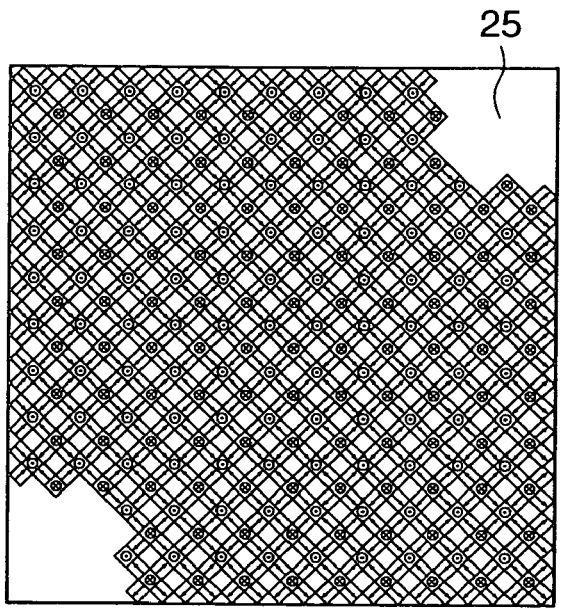
FIGS. 21A to 21C show modifications of the magnet arrangement of a magnet unit.
Figure 21B:
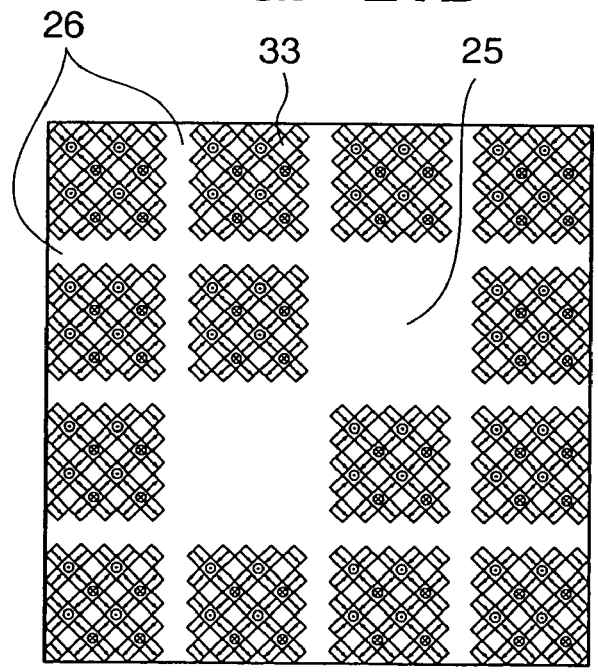
Figure 21C:
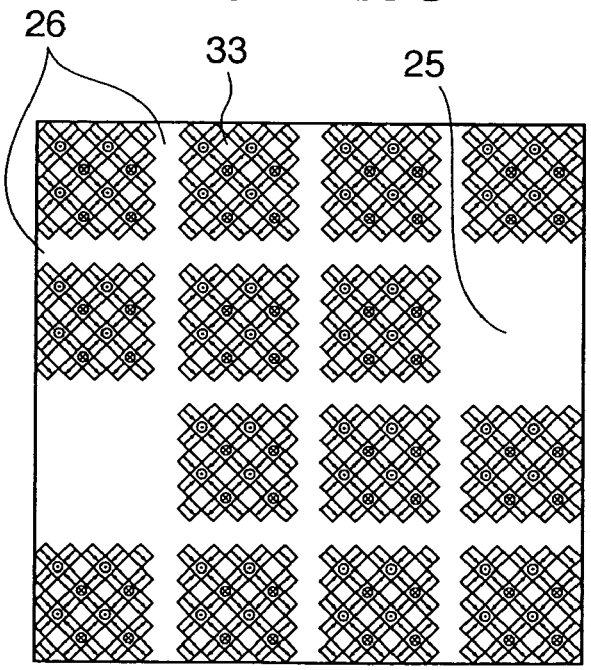

FIGS. 21A to 21C show modifications of the arrangement of the permanent magnets of the magnet unit provided under the movable stage. These modifications can be applied to both the first and second embodiments. FIG. 21A shows a structure in which the linear non-magnetic portions 26 in the first embodiment are eliminated and non-magnetic portions 25 are provided only to the two ends (upper right corner and lower left corner) of one diagonal. The control method is basically the same as that of the first embodiment and a description thereof will accordingly be omitted. The magnets in the first embodiment are divided into the small magnet units 33 each including thirty-three magnets. In this case, the magnetic flux decreases at the edge portion of each small magnet unit 33. With the structure of FIG. 21A, when the non-magnetic portions 26 are filled with magnets, the edge portions of the small magnetic units 33 can be eliminated. As a result, a decrease in magnetic flux can be eliminated to increase the thrust and the uniformity of the thrust.

FIG. 21B shows a structure in which the non-magnetic portions 25 of the first embodiment are arranged inside the movable stage. Even with this structure, in a certain coil layer, currents in the opposite directions may be supplied to the coil portions facing two non-magnetic portions to generate translating forces in the opposite directions, in the same manner as in the first embodiment. Alternatively, in a certain coil layer, the translating forces may be controlled separately between the upper and lower portions or the left and right portions of the movable stage, in the same manner as described above (the modification in which the stator unit includes four coil layers). Then, a moment in the ωz direction can be generated.

Also, non-magnetic portions 25 can be formed at the positions shown in FIG. 21C. What is common among the structures of FIGS. 21A to 21C is that the permanent magnets are arranged on the lower surface of the movable stage such that they are asymmetric with respect to a straight line parallel to the X direction and/or to a straight line parallel to a straight line parallel to the Y direction.

(Explanation of Coil Cooling System)

Figure 22A:
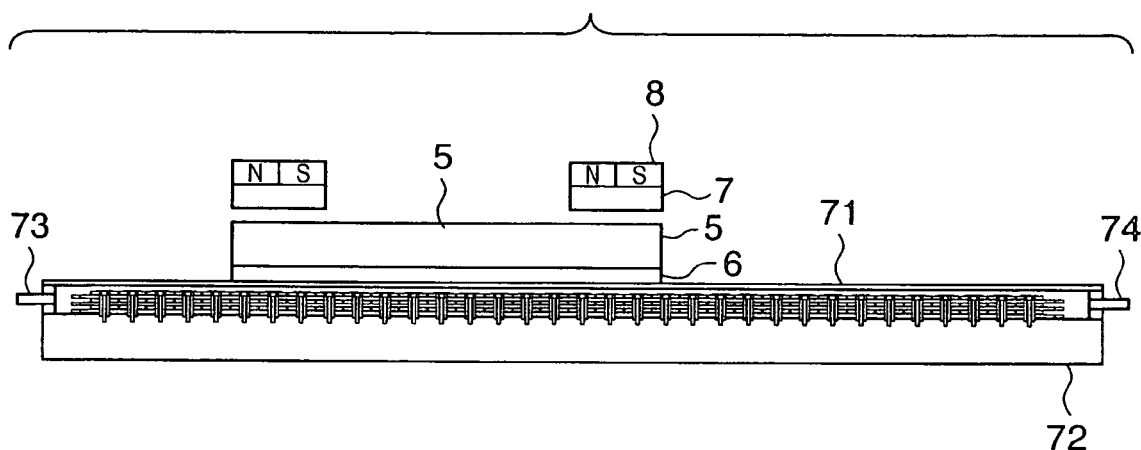
FIG. 22A is a view showing a coil direct cooling system.
Figure 22B:
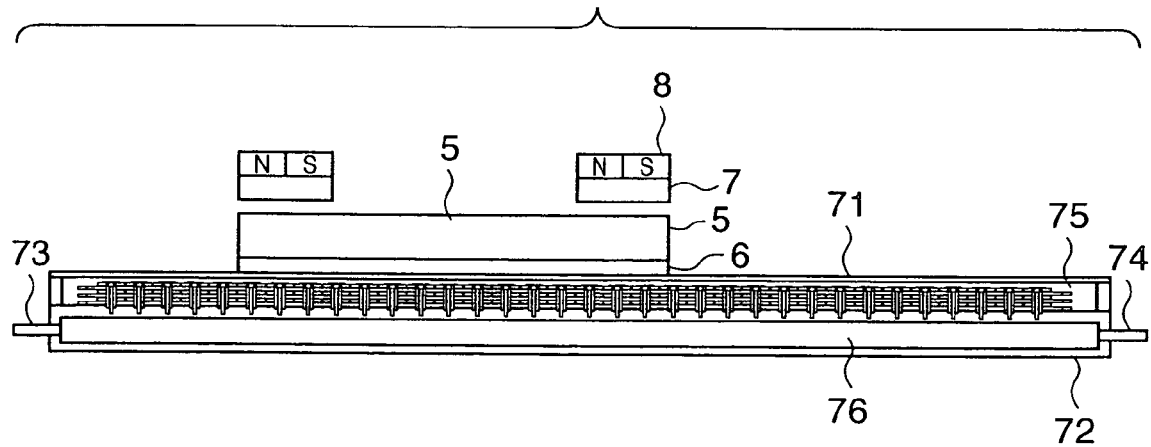
FIG. 22B is a view showing a coil indirect cooling system.

FIGS. 22A and 22B are views for explaining the structure of a coil cooling system. In the first and second embodiments and their modifications described above, coil heat generation is an issue. To prevent this, for example, the following cooling system is desirably provided. FIG. 22A shows a structure in which the coil is cooled by a refrigerant directly, and FIG. 22B shows a structure in which the coil is cooled by a refrigerant indirectly.

In FIG. 22A, the coil of a stator unit 70 is covered by a partition 71. The partition 71 may be integral with a base 72, or may be fixed to the base 72. The partition 71 has a supply port 73 for supplying a refrigerant and a discharge port 74 for discharging the refrigerant. A refrigerant such as Fluorinert® or pure water is supplied inside and discharged outside the partition 71, so that the temperature-controlled refrigerant is circulated by a circulating system (not shown). With this structure, the temperature increase of the coil can be decreased effectively.

In FIG. 22B, the inside of a partition 71, which covers the coil, is filled with a heat conductive material 75 having a high thermal conductivity. A refrigerant is circulated in a flow channel 76 such as a cooling pipe arranged in a base 72 by a circulating system (not shown). With this structure, the base 72 is cooled by the refrigerant. Heat is conducted from the base 72 to the heat conductive material 75 to cool the coil indirectly by the heat conductive material 75. Although the control accuracy of the coil temperature is more or less lower than that in the structure of FIG. 22A, as the coil and refrigerant do not come into direct contact with each other, the measure for insulation can be simple, and no countermeasure is necessary against leakage of the refrigerant. As the partition 71 does not receive the internal pressure of the refrigerant, the partition 71 can be made thin.

With the above structure, the coil can be cooled to be deprived of heat. Therefore, a larger current can be supplied to the coil, and the adverse influence that the ambient temperature around the coil imposes on the measurement accuracy can be decreased.

Third Embodiment

Figure 23:
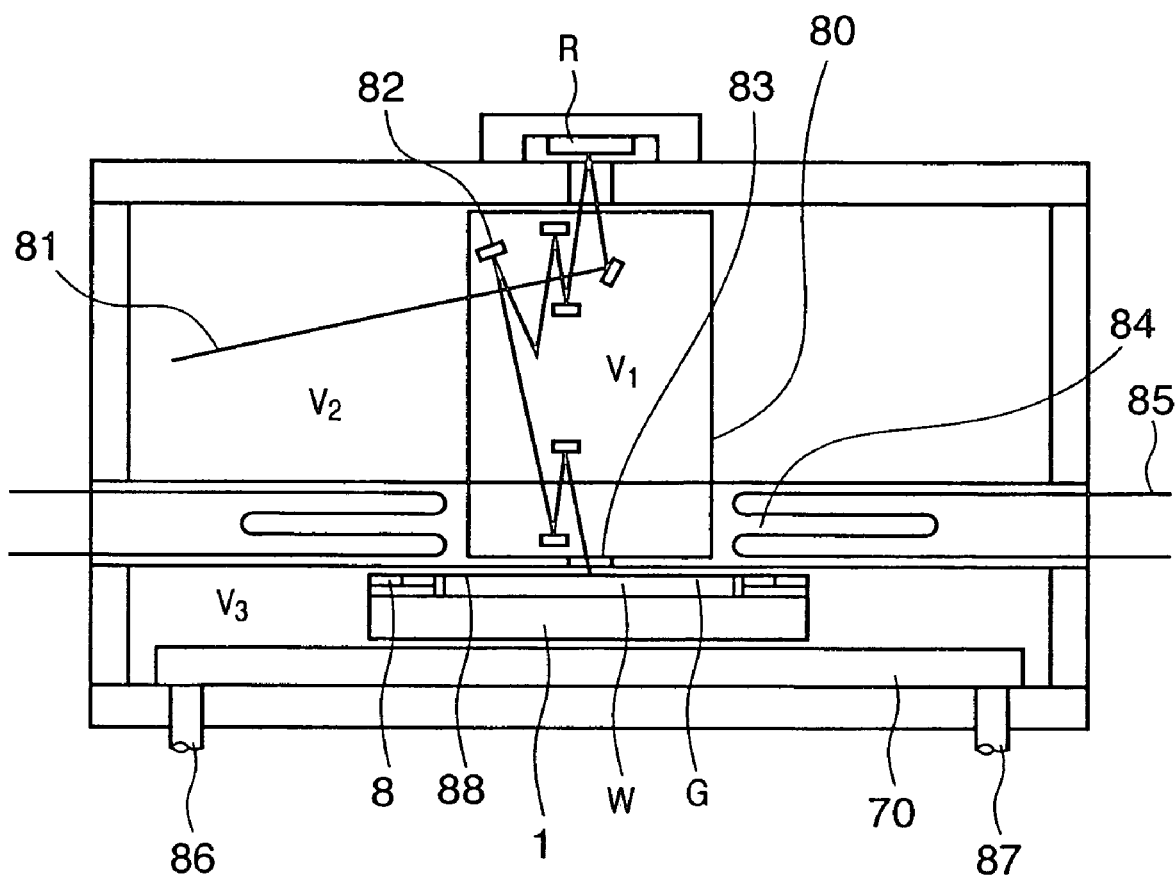
FIG. 23 is a view in which the present invention is applied to an EUV exposure apparatus.

FIG. 23 shows an example in which the aligning apparatus (stage device) described above is employed in a vacuum atmosphere. The aligning apparatus is applied to an exposure apparatus, which uses EUV (Extreme Ultra Violet) light, as exposure light. The EUV exposure apparatus prints a reticle pattern onto a wafer by using light having a very short wavelength of about 13 nm. When using short-wavelength light such as EUV light, a vacuum atmosphere is needed to prevent attenuation of the energy. In order to prevent contamination of the EUV optical system, a high-vacuum atmosphere is needed around the optical system.

A stage device as an aligning apparatus is set inside a partition 90 (vacuum chamber) having an interior filled with a vacuum atmosphere. The structure and operation of a movable stage 1 and stator unit 2 can be basically the same as those of the embodiments and modifications described above, and a detailed description thereof will accordingly be omitted.

A magnet unit (not shown) for generating a driving force is arranged on the lower surface of the movable stage 1. Permanent magnets 8 for generating an attracting force and a wafer chuck (not shown) for holding a wafer W are arranged on the upper surface of the movable stage 1. According to one characteristic feature of this embodiment, the upper surface of the wafer W and the upper surfaces of the attracting permanent magnets are located within one plane. A level plate 88 is provided among the wafer W, wafer chuck, and permanent magnets 8 to make a continuous surface from the upper surface of the wafer W to the upper surfaces of the attracting permanent magnets 8. An attracting plate 84 arranged above the movable stage 1 serves as a so called differential exhaust plate.

The differential exhaust plate will be described hereinafter. Referring to FIG. 23, the vacuum chamber has three regions ($V_1$, $V_2$, and $V_3$) having different vacuum degrees. The space where the movable stage 1 and stator unit 2 are arranged has the lowest vacuum degree among the three spaces (this space will be called a vacuum region $V_3$). The space around the EUV optical system has the next lowest vacuum degree (this space will be called a vacuum region $V_2$). The interior of the EUV optical system has the highest vacuum degree (this space will be called a vacuum region $V_1$). This is due to the following reason. Many factors that can cause degassing, e.g., a magnet, cable, top plate, and cooling jacket, exist in the space where the movable stage 1 and stator unit 2 are arranged, and it is accordingly difficult to maintain this space at a high vacuum. The EUV optical system includes a plurality of reflection mirrors 82. If a little water or carbon exists in the space where the reflection mirrors 82 are present, chemical compounds form on the surfaces of the mirrors to decrease the reflectance. To prevent this, the space where the EUV optical system is arranged requires a high vacuum. The spaces $V_1$ and $V_2$ cannot be completely partitioned by a wall because the EUV optical system extends through them.

In view of this, the differential exhaust plate 84 as shown in FIG. 23 is provided to face the upper surface of the movable stage 1 through a small gap G. When the space $V_1$ is evacuated to a high vacuum, a difference is formed in the vacuum degree between the spaces $V_1$ and $V_3$ to maintain their vacuums. The differential exhaust plate 84 also serves as the attracting plate (described above) and is made of a magnetic material. Alternatively, the differential exhaust plate 84 can have (incorporate) an attracting plate and a nonmagnetic or an insulating cover. In this case, apart from the small gap G for differential exhaust between the movable stage 1 and differential exhaust plate 84, a large magnetic gap is present between the movable stage 1 and differential exhaust plate 84.

When one member is used as both the differential exhaust plate and attracting plate in this manner, a device which maintains the high vacuum of the EUV optical system and a device which drives highly accurately while suppressing coil heat generation need not be provided separately. As a result, the exposure performance of the EUV exposure apparatus can be improved by a small-space, simple structure.

A cooling pipe 85 is arranged in the differential exhaust plate 84 to adjust it to a desired temperature. In the vacuum atmosphere, heat transfer is small and energy received from exposure light is accumulated. When heat is exchanged actively through the differential exhaust plate 84 in this manner, the temperatures of the wafer W, chuck, and top plate can be controlled to prevent their deformation, or the like. In other words, the differential exhaust plate 84 serves not only as the attracting plate but also as a radiation cooling plate.

In the above description, the attracting plate 84 incorporates a cover, and a large magnetic gap is designed between the attracting plate 84 and the permanent magnets 8 on the movable stage 1. Alternatively, the upper surfaces of the permanent magnets 8 can be lowered from the upper surface of the wafer W by about the magnetic gap, so that a cover having a thickness almost equal to the magnetic gap can be arranged on the permanent magnets 8. If the cover is formed as a level plate to form one surface continuous to the upper surface of the wafer W, the structure of the level plate becomes simple.

Fourth Embodiment

Figure 24:
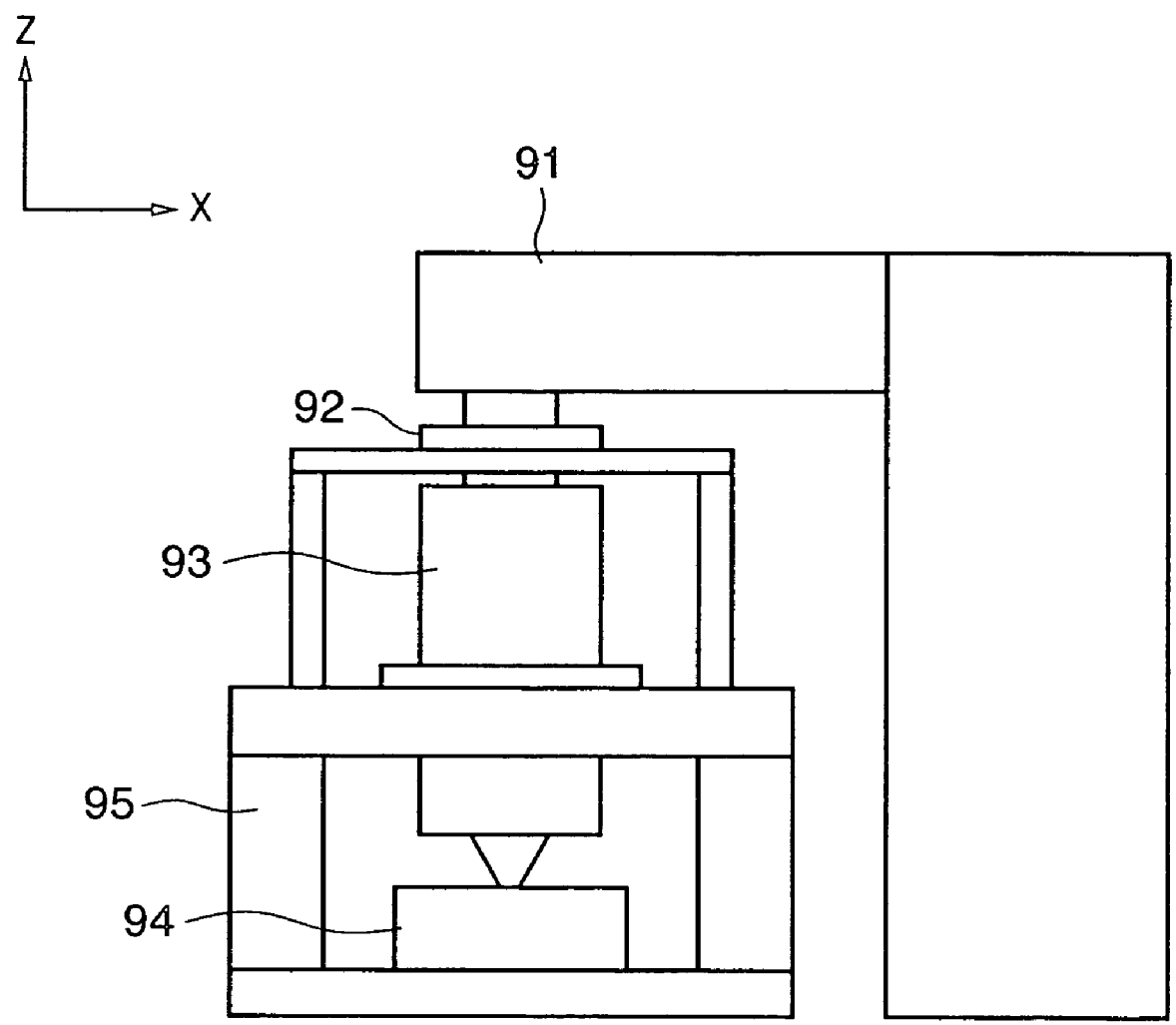
FIG. 24 is a view showing an exposure apparatus.

Other than the EUV exposure apparatus described above, the aligning apparatus described in the first embodiment or second embodiment can be suitably used as an exposure apparatus, in general. A general exposure apparatus will be briefly described with reference to FIG. 24.

The exposure apparatus is used to manufacture devices having fine patterns, e.g., a semiconductor device such as a semiconductor integrated circuit, a micromachine, and a thin film magnetic head. Exposure light (this is a generic term for visible light, ultraviolet light, EUV light, X-rays, an electron beam, a charged particle beam, or the like) serving as exposure energy from an illumination system unit 91 through a reticle as an original irradiates a semiconductor wafer W as a substrate through a projection lens 93 (this is a generic term for a dioptric lens, reflecting lens, cata-dioptric lens system, charged particle lens, or the like), serving as a projection system, to form a desired pattern on a substrate mounted on a wafer stage 94. As the wavelength of the exposure light becomes short, the exposure apparatus requires exposure in a vacuum atmosphere.

A wafer (object) as a substrate is held on a chuck mounted on the wafer stage 94. The pattern of the reticle as the original mounted on a reticle stage 92 is transferred onto the respective regions on the wafer by the illumination system unit 91 in accordance with step & repeat or step & scan. The aligning apparatus described in the first or second embodiment is used as the wafer stage 94 or reticle stage 92. In this case, the attracting plate has an opening through which the illumination system unit 91 or projection lens 93 is to extend.

Fifth Embodiment

Figure 25:
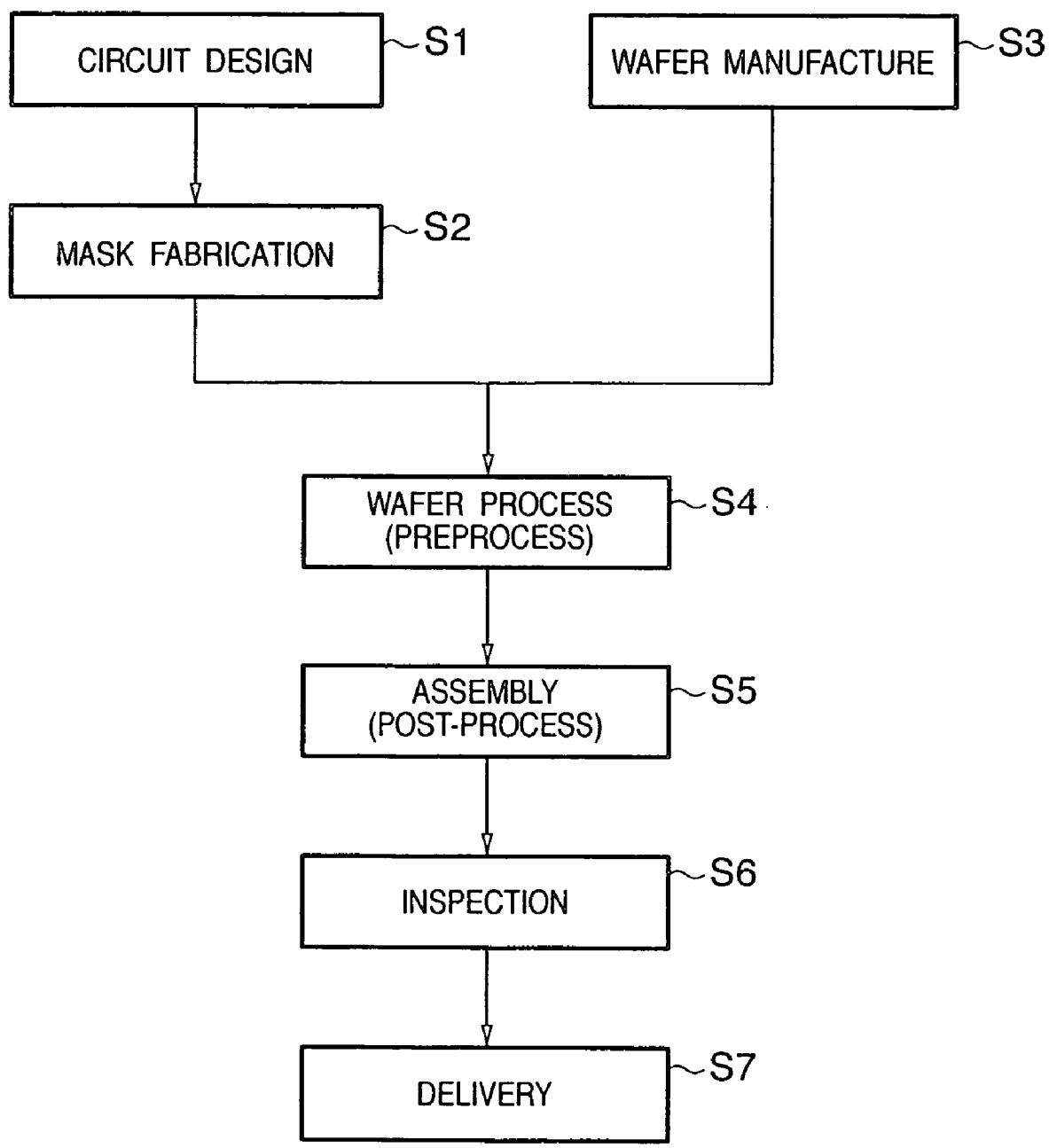
FIG. 25 is a flowchart showing a device manufacturing process.

A semiconductor device manufacturing process, which uses this exposure apparatus, will be described. FIG. 25 is a flowchart showing the flow of the entire semiconductor device manufacturing process. In step 1 (circuit design), the circuit of a semiconductor device is designed. In step 2 (mask fabrication), a mask is fabricated on the basis of the designed circuit pattern.

In step 3 (wafer manufacture), a wafer is manufactured using a material such as silicon. In step 4 (wafer process), called a preprocess, an actual circuit is formed on the wafer by the above exposure apparatus in accordance with lithography using the above mask and wafer. In the next step, step 5 (assembly), called a post process, a semiconductor chip is formed from the wafer fabricated in step 4. This step includes assembly processes such as assembly (dicing and bonding) and packaging (chip encapsulation). In step 6 (inspection), inspections including an operation check test and a durability test of the semiconductor device fabricated in step 5 are performed. A semiconductor device is finished with these processes and delivered in step 7.

The wafer process of the above step 4 includes the following steps, i.e., an oxidation step of oxidizing the surface of the wafer, a CVD step of forming an insulating film on the wafer surface, an electrode formation step of forming an electrode on the wafer by deposition, an ion implantation step of implanting ions in the wafer, a resist process step of applying a photosensitive agent to the wafer, an exposure step of transferring the circuit pattern to the wafer after the resist process step by the exposure apparatus described above, a developing step of developing the wafer exposed in the exposure step, an etching step of removing portions other than the resist image developed in the developing step, and a resist removal step of removing any unnecessary resist after etching. These ste are repeated to form multiple circuit patterns on the wafer.

As many apparently widely different embodiments of the present invention can be made without departing from the spirit and scope thereof, it is to be understood that the invention is not limited to the specific embodiments thereof except as defined in the claims.

CLAIM OF PRIORITY

This application claims priority from Japanese Patent Application No. 2004 059162 filed on Mar. 3, 2004, which is hereby incorporated by reference herein.

What is claimed is:

1. An aligning apparatus comprising:
a moving member;
a magnetic member arranged vertically above said moving member;
a stator unit which is arranged vertically below said moving member and has a plurality of coils;
a first permanent magnet unit which is fixed on an upper surface of said moving member and generates a vertical force with said magnetic member;
a second permanent magnet unit which is fixed on a lower surface of said moving member and generates a horizontal force with said stator unit; and
an attraction preventing plate provided between said first permanent magnet unit and said magnetic member for preventing said first permanent magnet unit and said magnetic member from attracting to each other,
wherein said stator unit is composed of a nonmagnetic member, and
wherein said aligning apparatus has no coils between said moving member and said magnetic member.

2. The apparatus according to claim 1, wherein the force generated between said first permanent magnet unit and said magnetic member balances with a weight of said moving member.

3. The apparatus according to claim 1, wherein said moving member can be driven at least vertically by the force generated between said stator and said second permanent magnet unit.

4. The apparatus according to claim 3, wherein said moving member can be driven in six axis directions.

5. The apparatus according to claim 4, wherein
the six axis directions include X-axis, Y-axis, and Z-axis directions and rotational directions about the X-, Y-, and Z-axes, and
said second permanent magnet unit has a plurality of permanent magnets arranged asymmetrically with respect to a straight line parallel to at least one of the X-axis direction and the Y-axis direction.

6. The apparatus according to claim 1, wherein said magnetic member has a stacked layer structure obtained by stacking thin plates.

7. The apparatus according to claim 1, wherein said attraction preventing means covers said magnetic member.

8. The apparatus according to claim 1, wherein said stator unit has a coil layer obtained by arraying a plurality of substantially elliptical coils, each having a straight portion in a predetermined direction, in a direction perpendicular to the predetermined direction.

9. The apparatus according to claim 8, wherein said coil layer of said stator unit includes a plurality of coil layers arrayed in a direction of a weight thereof, at least one of said plurality of coil layers having a substantially elliptical coil having a straight portion in a direction different from that of any other remaining one of said coil layers.

10. The apparatus according to claim 1, which has a partition to cover said plurality of coreless coils of said stator unit, wherein a temperature adjusting fluid is circulated inside said partition.

11. The apparatus according to claim 1, which has a partition to cover said plurality of coreless coils of said stator unit, wherein a heat conductive material fills inside said partition.

12. The apparatus according to claim 1, which has at least two moving members.

13. The apparatus according to claim 1, wherein said magnetic member comprises a plate like member having an opening, and exhausts a space above the opening.

14. The apparatus according to claim 1, wherein
said aligning apparatus is used in a vacuum atmosphere, and
said magnetic member comprises a plate like member having an opening,
said plate like member serving as differential exhaust means for making a difference between a vacuum degree in a space above the opening and a vacuum degree in the vicinity of said moving member.

15. An exposure apparatus for exposing a pattern of an original onto a substrate, wherein an aligning apparatus according to claim 1 is used as an aligning apparatus which aligns at least one of the original and the substrate.

16. A device manufacturing method which manufactures a device by using an exposure apparatus according to claim 15 in at least part of a manufacturing process.

17. An aligning apparatus comprising:
a moving member;
a magnetic member arranged vertically above said moving member;
a stator unit which is arranged vertically below said moving member and has a plurality of coils;
a first permanent magnet unit which is fixed on an upper surface of said moving member and generates a vertical force with said magnetic member;
a second permanent magnet unit which is fixed on a lower surface of said moving member and generates a horizontal force with said stator unit; and
an attraction preventing plate provided between said first permanent magnet unit and said magnetic member for preventing said first permanent magnet unit and said magnetic member from attracting to each other,
wherein said aligning apparatus has no coils between said moving member and said magnetic member.

* * * * *